(12) United States Patent
Wei et al.

(10) Patent No.: US 12,148,751 B2
(45) Date of Patent: Nov. 19, 2024

(54) USE OF A PLACEHOLDER FOR BACKSIDE CONTACT FORMATION FOR TRANSISTOR ARRANGEMENTS

(71) Applicant: Intel Corporation, Santa Clara, CA (US)

(72) Inventors: Andy Chih-Hung Wei, Yamhill, OR (US); Anand S. Murthy, Portland, OR (US); Mauro J. Kobrinsky, Portland, OR (US); Guillaume Bouche, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 822 days.

(21) Appl. No.: 17/084,977

(22) Filed: Oct. 30, 2020

(65) Prior Publication Data

US 2022/0139911 A1 May 5, 2022

(51) Int. Cl.
*H01L 27/088* (2006.01)
*H01L 23/522* (2006.01)
(Continued)

(52) U.S. Cl.
CPC ...... *H01L 27/0886* (2013.01); *H01L 23/5226* (2013.01); *H01L 29/0665* (2013.01);
(Continued)

(58) Field of Classification Search
CPC ..... H01L 27/088–0886; H01L 23/5226; H01L 29/0665; H01L 29/41791; H01L 29/6681; H01L 29/785
See application file for complete search history.

(56) References Cited

U.S. PATENT DOCUMENTS

2020/0075771 A1 3/2020 Kobrinsky et al.
2020/0185501 A1* 6/2020 Ma .................... H01L 29/66742
(Continued)

FOREIGN PATENT DOCUMENTS

EP 3479411 A1 5/2019
EP 3629382 A1 4/2020
(Continued)

OTHER PUBLICATIONS

Lin, Youbo: "Structure, Mechanical Properties and Fracture Behavior of Organiosilicate Glass Thin Films", Mar. 2007, https://projects.iq.harvard.edu/files/vlassakgroup/files/youbolinthesis.pdf (Year: 2007).*
(Continued)

*Primary Examiner* — Syed I Gheyas
*Assistant Examiner* — Casey Paul Boatman
(74) *Attorney, Agent, or Firm* — Akona IP PC

(57) ABSTRACT

Methods for fabricating a transistor arrangement of an IC structure by using a placeholder for backside contact formation, as well as related semiconductor devices, are disclosed. An example method includes forming, in a support structure (e.g., a substrate, a chip, or a wafer), a dielectric placeholder for a backside contact as the first step in the method. A nanosheet superlattice is then grown laterally over the dielectric placeholder, and a stack of nanoribbons is formed based on the superlattice. The nanoribbons are processed to form S/D regions and gate stacks for future transistors. The dielectric placeholder remains in place until the support structure is transferred to a carrier wafer, at which point the dielectric placeholder is replaced with the backside contact. Use of a placeholder for backside contact formation allows alignment of contact from the backside to appropriate device ports of a transistor arrangement.

20 Claims, 31 Drawing Sheets

(51) Int. Cl.
   *H01L 29/06*     (2006.01)
   *H01L 29/417*    (2006.01)
   *H01L 29/66*     (2006.01)
   *H01L 29/78*     (2006.01)

(52) U.S. Cl.
   CPC .... *H01L 29/41791* (2013.01); *H01L 29/6681* (2013.01); *H01L 29/785* (2013.01)

(56) References Cited

U.S. PATENT DOCUMENTS

| | | | |
|---|---|---|---|
| 2020/0294998 A1* | 9/2020 | Lilak | H01L 23/53295 |
| 2021/0202385 A1* | 7/2021 | Huang | H01L 29/785 |
| 2021/0391421 A1* | 12/2021 | Chu | H01L 29/66545 |

FOREIGN PATENT DOCUMENTS

| | | |
|---|---|---|
| EP | 3675158 A2 | 7/2020 |
| EP | 3930003 A1 | 12/2021 |
| WO | 2018039645 A1 | 3/2018 |

OTHER PUBLICATIONS

European Extended Search Report issued in EP Application No. 21190793.6 on Jan. 28, 2022; 11 pages.

\* cited by examiner

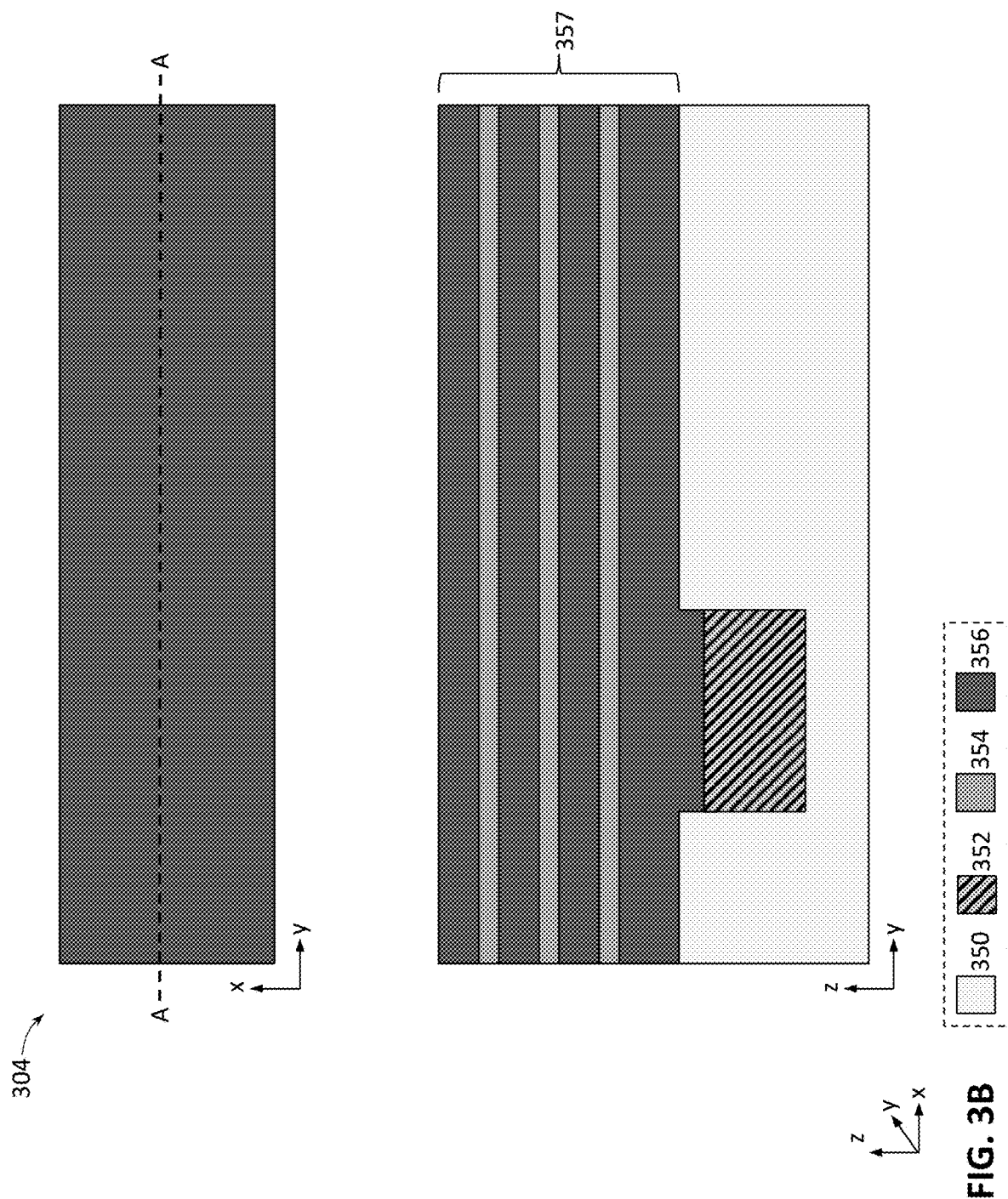

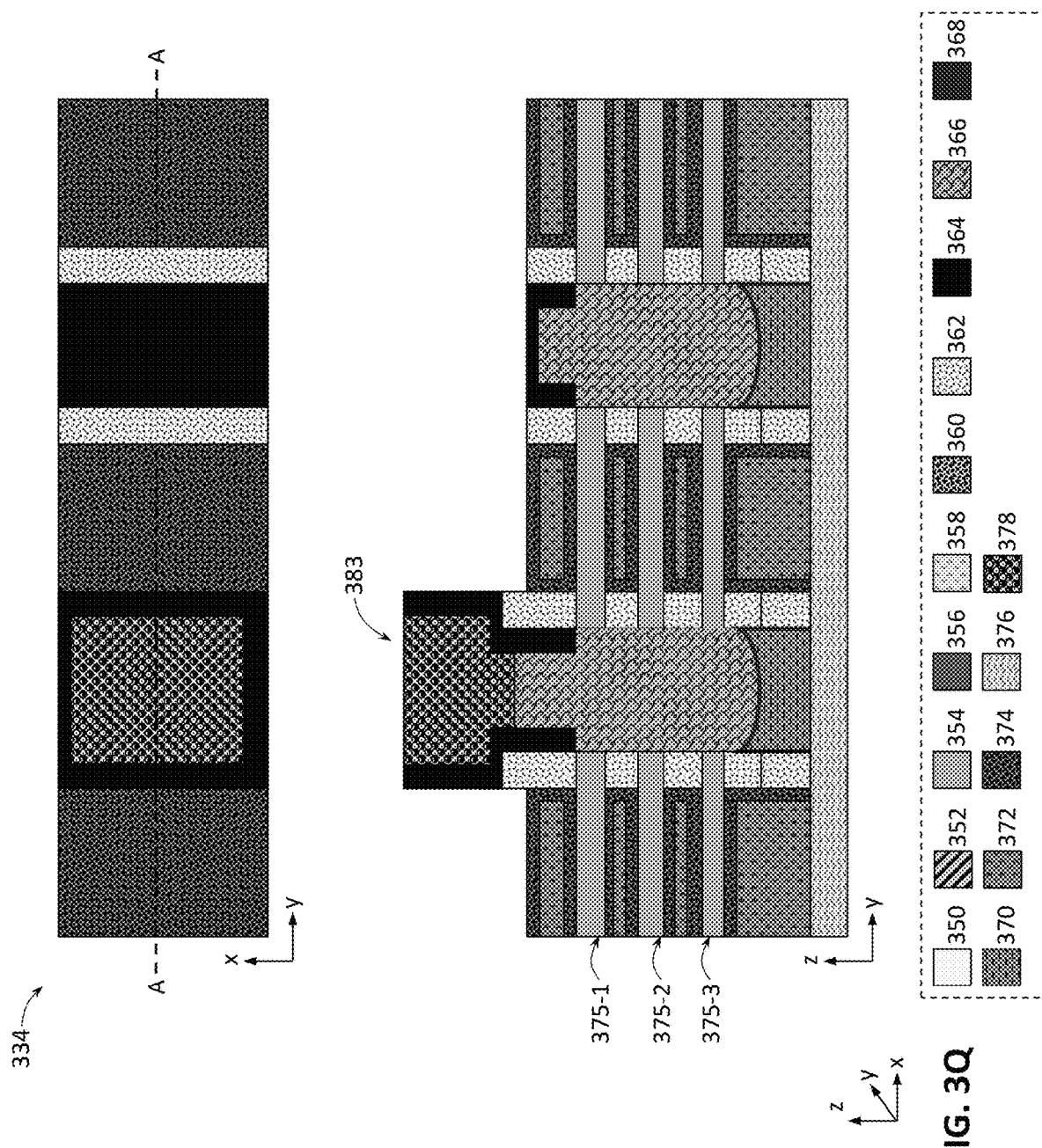

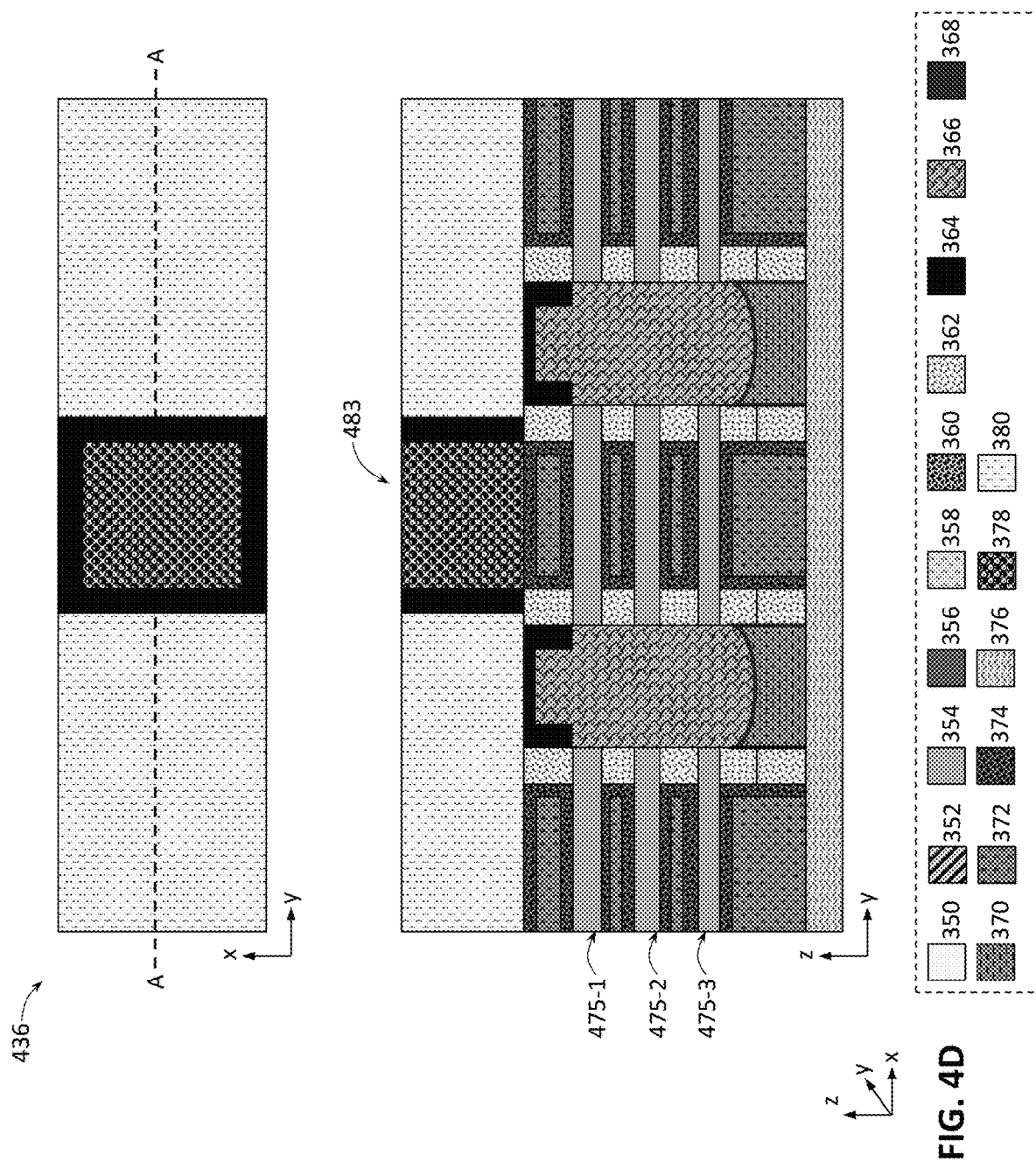

USE OF A PLACEHOLDER FOR BACKSIDE CONTACT FORMATION FOR TRANSISTOR ARRANGEMENTS

TECHNICAL FIELD

This disclosure relates generally to the field of semiconductor devices, and more specifically, to backside contacts for transistor arrangements.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4E provide top-down and cross-sectional side views at various stages in the manufacture of an example nanoribbon-based transistor arrangement with a backside gate contact according to the method of FIG. 2, in accordance with some embodiments.

DETAILED DESCRIPTION

Overview

Figure 1:
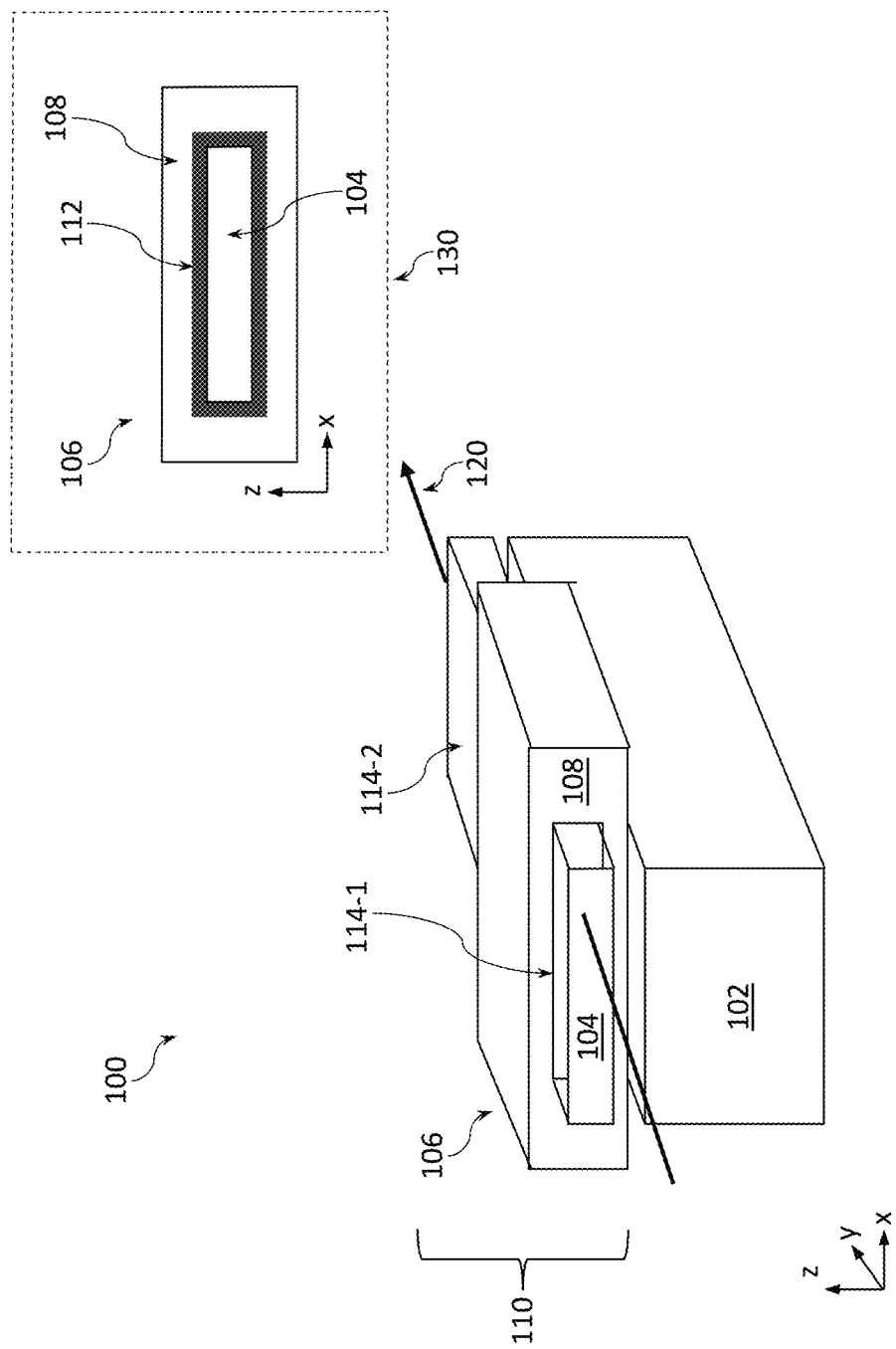
FIG. 1 provides a perspective view of an example nanoribbon-based field-effect transistor (FET), in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating transistor arrangements fabricated using a placeholder for backside contact formation, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

Conventional transistors have both S/D contacts on one side of the transistor, usually on the side facing away from the substrate. Recently, transistor arrangements in which a transistor has one S/D contact on one side and another S/D contact on the other side have been explored. The side of a transistor facing away from the substrate may be referred to as a "front" side while the other side may be referred to as a "back" side. Thus, a transistor contact made from the front side is referred to as a "frontside contact," while a transistor contact made from the back side is referred to as a "backside contact."

Backside contact technology, e.g., for backside power delivery, is key to further standard cell scaling. Inventors of the present disclosure realized that state-of-the-art approaches to forming backside contacts for transistors arrangements have certain limitations, in particular, when applied to non-planar transistors such as nanoribbon-based transistors.

Non-planar transistors such as double-gate transistors, trigate transistors, FinFETs, nanowire, and nanoribbon transistors refer to transistors having a non-planar architecture. In comparison to a planar architecture where the transistor channel has only one confinement surface, a non-planar architecture is any type of architecture where the transistor channel has more than one confinement surfaces. A confinement surface refers to a particular orientation of the channel surface that is confined by the gate field. Non-planar transistors potentially improve performance relative to transistors having a planar architecture, such as single-gate transistors.

Disclosed herein are methods for fabricating an IC structure having a transistor arrangement, e.g., a nanoribbon-based transistor arrangement, by using a placeholder for backside contact formation, as well as related semiconductor devices. An example method includes forming, in a support structure (e.g., a substrate, a chip, or a wafer), a dielectric placeholder for a backside contact as the first step in the method. A nanosheet superlattice is then grown laterally over the dielectric placeholder, and a stack of nanoribbons is formed based on the superlattice. The nanoribbons are processed to form S/D regions and gate stacks for future transistors. The dielectric placeholder remains in place until the support structure is transferred to a carrier wafer, at which point the dielectric placeholder is replaced with the backside contact. Use of a placeholder for backside contact formation allows alignment of contact from the backside to appropriate device ports of a transistor arrangement.

While not limited to, using a placeholder for backside contact formation may be particularly advantageous for nanoribbon-based transistor arrangements. As used herein, the term "nanoribbon" refers to an elongated semiconductor structure having a long axis parallel to a support structure over which a transistor arrangement is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular or square-like transverse cross-section. In the present disclosure, the term "nanoribbon" is used to describe both such nanoribbons (including nanosheets) and nanowires, as well as elongated semiconductor structures with a longitudinal axis parallel to the support structures and with having transverse cross-sections of any geometry (e.g., oval, or a polygon with rounded corners). As used herein, the term "face of a nanoribbon" refers to any of the confinement surfaces (i.e., interfaces of the semiconductor material of the nanoribbon with the gate stack) of the nanoribbon which are substantially parallel to the support structure when a nanoribbon extends in a direction parallel to the support structure, while the term "sidewall of a nanoribbon" refers to any of the confinement surfaces of the nanoribbon connecting the bottom face and the top face (the bottom face being the face of the nanoribbon that is closer to the support structure than the top face). In one aspect of the present disclosure, an example nanoribbon transistor arrangement includes a channel material shaped as a nanoribbon, and a gate stack wrapping around at least a portion of a first (e.g., bottom) face of the nanoribbon, both sidewalls, and a portion of a second (e.g., top) face of the nanoribbon.

While the descriptions are provided herein with reference to nanoribbons, the principles of using a placeholder for backside contact formation, described herein, are equally applicable to transistor arrangements where a channel material is shaped as a structure where the length of the structure (e.g., a dimension measured along the y-axis of the example coordinate system shown in the present drawings) is similar to the thickness of the structure (e.g., a dimension measured along the z-axis of the example coordinate system shown in the present drawings).

Various IC devices with one or more transistor arrangements fabricated using a placeholder for backside contact formation as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on an IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 3A-3S, such a collection may be referred to herein without the letters, e.g., as "FIG. 3."

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more transistor arrangements fabricated using a placeholder for backside contact formation as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D region/contact" to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" may be used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" may be used to describe an electrically conductive element that interconnects two or more trench contacts of different levels. To that end, a via may be provided substantially perpendicularly to the plane of an IC chip and may interconnect two trench contacts in adjacent levels or two trench contacts in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example Nanoribbon Transistor Arrangement

FIG. 1 provides a perspective view of an example IC structure with a nanoribbon-based FET 110 that may be adapted to form a transistor arrangement using a placeholder for backside contact formation, in accordance with various embodiments. For example, in various embodiments, the transistor 110 formed on the basis of a nanoribbon 104, shown in FIG. 1, may be formed on the basis of any of the nanoribbons 375 of the nanoribbon-based transistor arrangements shown in FIG. 3S or FIG. 4E, except that the support structure 102 may be replaced with a replacement dielectric material 380 and one or more contacts to any of the terminals of the transistor 110 may be implemented as backside contacts, as described below.

Turning to the details of FIG. 1, the arrangement 100 may include a channel material formed as a nanoribbon 104 made of one or more semiconductor materials, the nanoribbon 104 provided over a support structure 102. The transistor 110 may be formed on the basis of the nanoribbon 104 by having a gate stack 106 wrap around at least a portion of the nanoribbon referred to as a "channel portion" and by having source and drain regions, shown in FIG. 1 as a first source or drain (S/D) region 114-1 and a second S/D region 114-2 on either side of the gate stack 106. In some embodiments, a layer of oxide material (not specifically shown in FIG. 1) may be provided between the support structure 102 and the gate stack 106.

The arrangement 100 shown in FIG. 1 (and other figures of the present disclosure) is intended to show relative arrangements of some of the components therein, and the arrangement 100, or portions thereof, may include other components that are not illustrated (e.g., electrical contacts to the S/D regions 114 of the transistor 110, additional layers such as a spacer layer around the gate electrode of the transistor 110, etc.). For example, although not specifically illustrated in FIG. 1, a dielectric spacer may be provided between the source electrode and the gate stack as well as between the transistor drain electrode and the gate stack of the transistor 110 in order to provide electrical isolation between the source, gate, drain electrodes. In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Other examples of low-k dielectric materials include organic polymers such as polyimide, polynorbornenes, benzocyclobutene, perfluorocyclobutane, or polytetrafluoroethylene (PTFE). Still other examples of low-k dielectric materials include silicon-based polymeric dielectrics such as hydrogen silsesquioxane (HSQ) and methylsilsesquioxane (MSQ). Some examples of low-k materials include various porous dielectric materials, such as for example porous silicon dioxide or porous carbon-doped silicon dioxide, where relatively large voids or pores are created in a dielectric layer in order to reduce the overall dielectric constant of the layer, since voids can have a dielectric constant of nearly 1.

Implementations of the present disclosure may be formed or carried out on any suitable support structure 102, such as a substrate, a die, a wafer, or a chip. The support structure 102 may, e.g., be the wafer 2000 of FIG. 5A, discussed below, and may be, or be included in, a die, e.g., the singulated die 2002 of FIG. 5B, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which a semiconductor device implementing any of the transistor arrangements fabricated using a placeholder for backside contact formation as described herein may be built falls within the spirit and scope of the present disclosure.

The nanoribbon 104 may take the form of a nanowire or nanoribbon, for example. In some embodiments, an area of a transversal cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). In some embodiments, a width of the nanoribbon 104 (i.e., a dimension measured in a plane parallel to the support structure 102 and in a direction perpendicular to a long axis 120 of the nanoribbon 104, e.g., along the x-axis of the example coordinate system shown in FIG. 1) may be at least about 3 times larger than a height of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger. Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. For any orientation of the nanoribbon 104 with respect to the support structure 102, a "face" of a nanoribbon refers to the side of the nanoribbon that is larger than the side perpendicular to it (when measured in a plane substantially perpendicular to the long axis 120 of the nanoribbon 104), the latter side being referred to as a "sidewall" of a nanoribbon.

In some embodiments, the channel material of the nanoribbon 104 may be composed of semiconductor material systems including, for example, N-type or P-type materials systems. In some embodiments, the channel material of the nanoribbon 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the nanoribbon 104 may include a combination of semiconductor materials. In some embodiments, the channel material of the nanoribbon 104 may include a monocrystalline semiconductor, such as silicon (Si) or germanium (Ge). In some embodiments, the channel material of the nanoribbon 104 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an N-type metal-oxide-semiconductor (NMOS) transistor), the channel material of the nanoribbon 104 may advantageously include a III-V material having a high electron mobility, such as, but not limited to InGaAs, InP, InSb, and InAs. For some such embodiments, the channel material of the nanoribbon 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material of the nanoribbon 104 may be an intrinsic III-V material, i.e., a III-V semiconductor material not intentionally doped with any electrically active impurity. In alternate embodiments, a nominal impurity dopant level may be present within the channel material of the nanoribbon 104, for example to further fine-tune a threshold voltage Vt, or to provide HALO pocket implants, etc. Even for impurity-doped embodiments however, impurity dopant level within the channel material of the nanoribbon 104 may be relatively low, for example below $10^{15}$ dopant atoms per cubic centimeter (cm$^{-3}$), and advantageously below $10^{13}$ cm$^{-3}$.

For some example P-type transistor embodiments (i.e., for the embodiments where the transistor 110 is a P-type metal-oxide-semiconductor (PMOS) transistor), the channel material of the nanoribbon 104 may advantageously be a group IV material having a high hole mobility, such as, but not limited to Ge or a Ge-rich SiGe alloy. For some example embodiments, the channel material of the nanoribbon 104 may have a Ge content between 0.6 and 0.9, and advantageously may be at least 0.7. In some embodiments with highest mobility, the channel material of the nanoribbon 104 may be intrinsic III-V (or IV for P-type devices) material and not intentionally doped with any electrically active impurity. In alternate embodiments, one or more a nominal impurity dopant level may be present within the channel material of the nanoribbon 104, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

In some embodiments, the channel material of the nanoribbon 104 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 104 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 104 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

A gate stack 106 including a gate electrode material 108 and, optionally, a gate dielectric material 112, may wrap entirely or almost entirely around a portion of the nanoribbon 104 as shown in FIG. 1, with the active region (channel region) of the channel material of the transistor 110 corresponding to the portion of the nanoribbon 104 wrapped by the gate stack 106. The gate dielectric material 112 is not shown in the perspective drawing of the arrangement 100 shown in FIG. 1, but is shown in an inset 130 of FIG. 1, providing a cross-sectional side view of a portion of the nanoribbon 104 with a gate stack 106 wrapping around it. As shown in FIG. 1, the gate dielectric material 112 may wrap around a transversal portion of the nanoribbon 104 and the gate electrode material 108 may wrap around the gate dielectric material 112.

The gate electrode material 108 may include at least one P-type work function metal or N-type work function metal, depending on whether the transistor 110 is a PMOS transistor or an NMOS transistor (P-type work function metal used as the gate electrode material 108 when the transistor 110 is a PMOS transistor and N-type work function metal used as the gate electrode material 108 when the transistor 110 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric material 112 may include one or more high-k dielectrics including any of the materials discussed herein with reference to the insulator material that may surround portions of the transistor 110. In some embodiments, an annealing process may be carried out on the gate dielectric material 112 during manufacture of the transistor 110 to improve the quality of the gate dielectric material 112. The gate dielectric material 112 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, e.g., when the transistor 110 is a storage transistor of a memory cell, the gate dielectric 112 may be replaced with, or complemented with a layer of a ferroelectric material. Such a ferroelectric material may include one or more materials which exhibit sufficient ferroelectric or antiferroelectric behavior even at thin dimensions. Some examples of such materials known at the moment include hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and yttrium-doped (Y-doped) hafnium oxide. However, in other embodiments, any other materials which exhibit ferroelectric or antiferroelectric behavior at thin dimensions may be used to replace, or to complement, the gate dielectric 112 when the transistor 110 is a storage transistor, and are within the scope of the present disclosure. The ferroelectric material included in the gate stack 106 when the transistor 110 is a storage transistor, may have a thickness that may, in some embodiments, be between about 0.5 nanometers and 10 nanometers, including all values and ranges therein (e.g., between about 1 and 8 nanometers, or between about 0.5 and 5 nanometers).

As further shown in FIG. 1, the nanoribbon 104 may include a source region and a drain region on either side of the gate stack 106, thus realizing a transistor. As is well known in the art, source and drain (S/D) regions are formed for the gate stack of each metal-oxide-semiconductor (MOS) transistor. As described above, the source and drain regions of a transistor are interchangeable, and a nomenclature of a first S/D region and a second S/D region of a transistor has been introduced for use in the present disclosure. In FIG. 1, reference numeral 114-1 is used to label the first S/D region, S/D1, and reference numeral 114-2 is used to label the second S/D region, S/D2, of the transistor 110.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

Example Fabrication of Nanoribbon-Based Transistor Arrangements Using a Placeholder for Backside Contact Formation The nanoribbon 104 may form a basis for forming transistor arrangements fabricated using a placeholder for backside contact formation.

Figure 2A:
FIGS. 2A-2B provide a flow diagram of an example method of manufacturing a transistor arrangement using a placeholder for backside contact formation, in accordance with some embodiments.
Figure 2B:

FIGS. 2A-2B provide a flow diagram of an example method 200 manufacturing a transistor arrangement using a placeholder for backside contact formation, in accordance with some embodiments. Although the operations of the method 200 are illustrated once each and in a particular order, the operations may be performed in any suitable order and repeated as desired. For example, one or more operations may be performed in parallel to manufacture multiple transistor arrangements fabricated using a placeholder for backside contact formation substantially simultaneously. In another example, the operations may be performed in a different order to reflect the structure of an IC device in which the transistor arrangements fabricated using a placeholder for backside contact formation will be included.

In addition, the example manufacturing method 200 may include other operations not specifically shown in FIG. 2, such as various cleaning or planarization operations as known in the art. For example, in some embodiments, the support structure 102, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figure 3A:
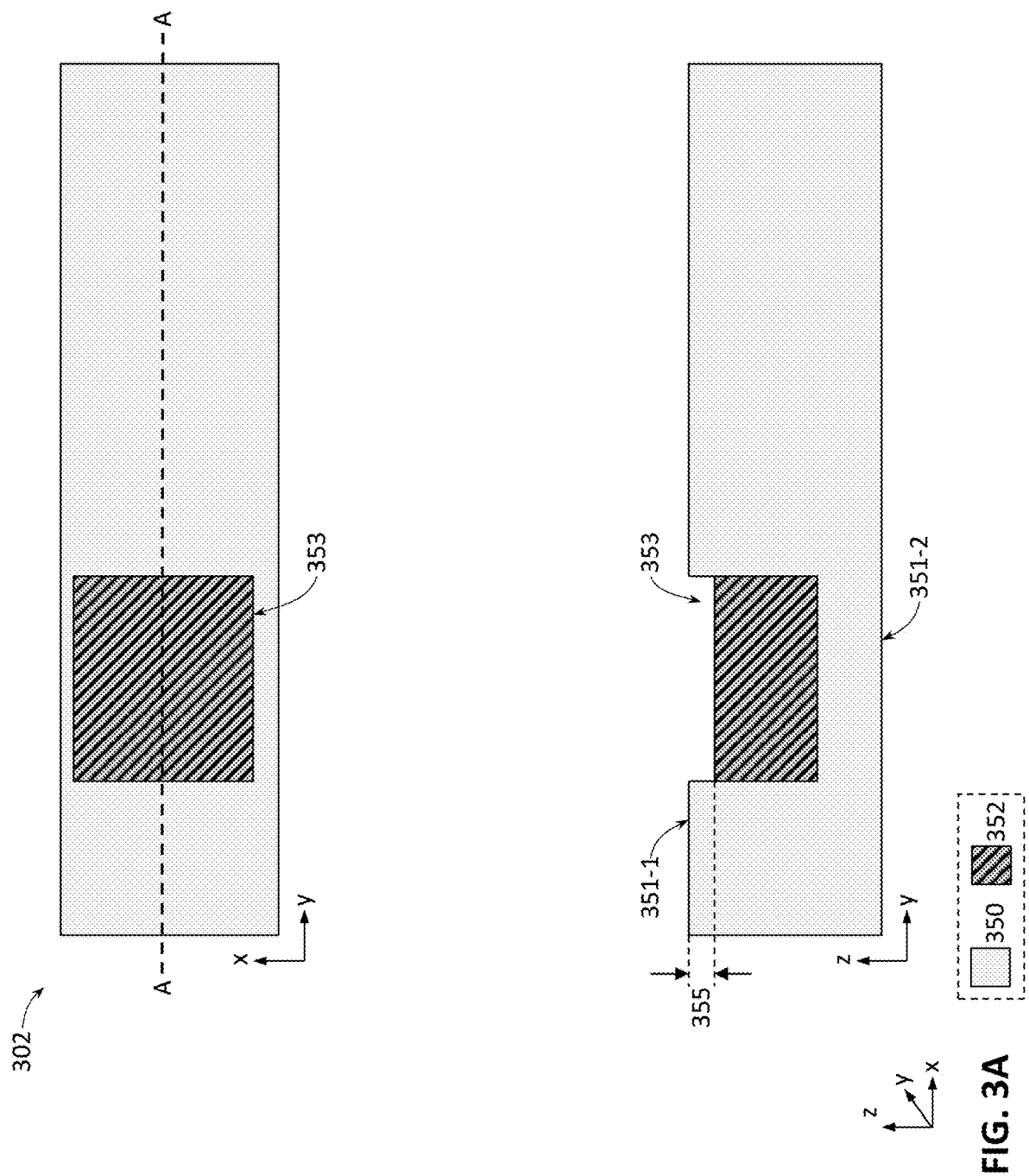
FIGS. 3A-3S provide top-down and cross-sectional side views at various stages in the manufacture of an example nanoribbon-based transistor arrangement with a backside source or drain (S/D) contact according to the method of FIG. 2, in accordance with some embodiments.
Figure 3C:
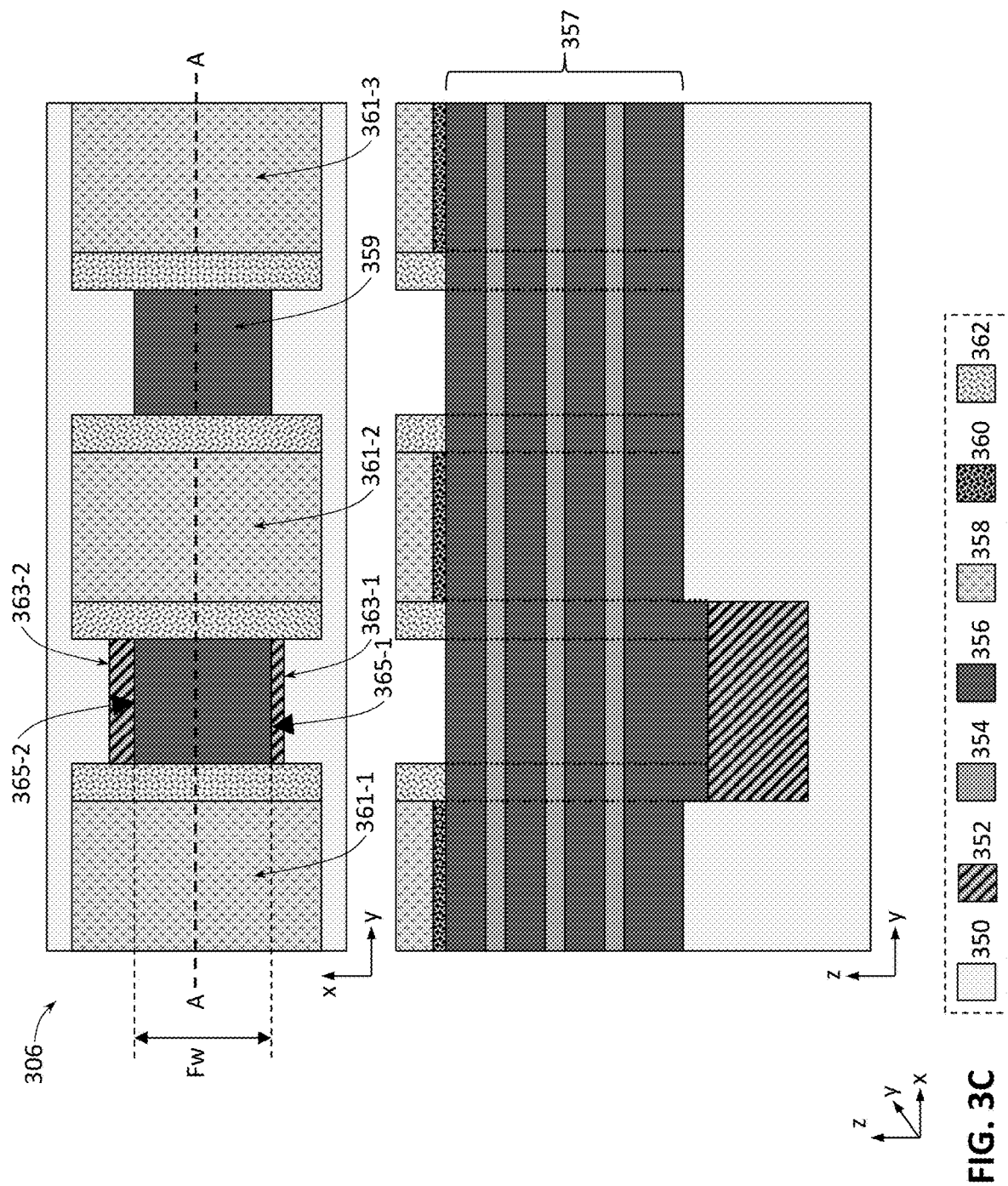
Figure 3D:
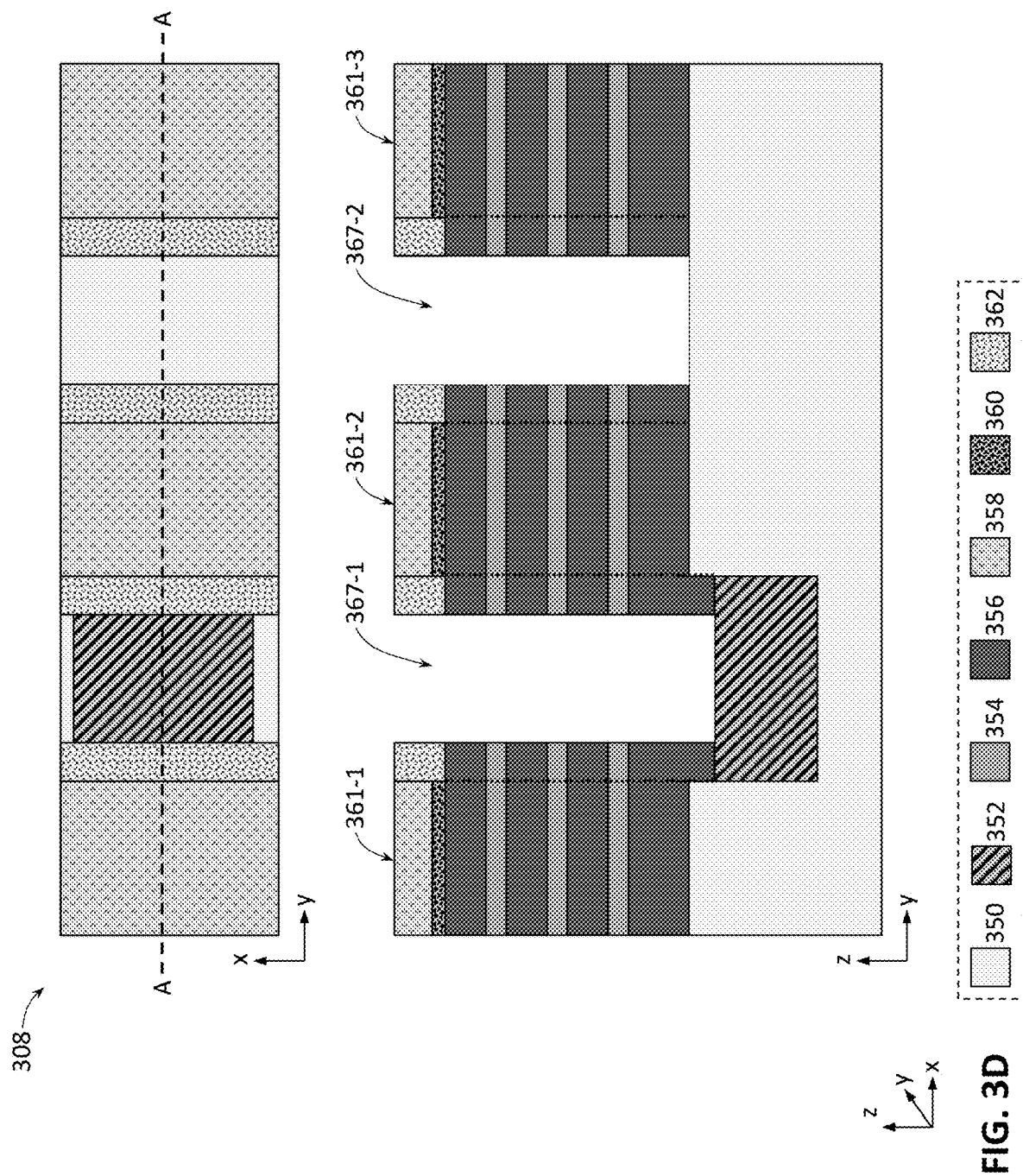
Figure 3E:
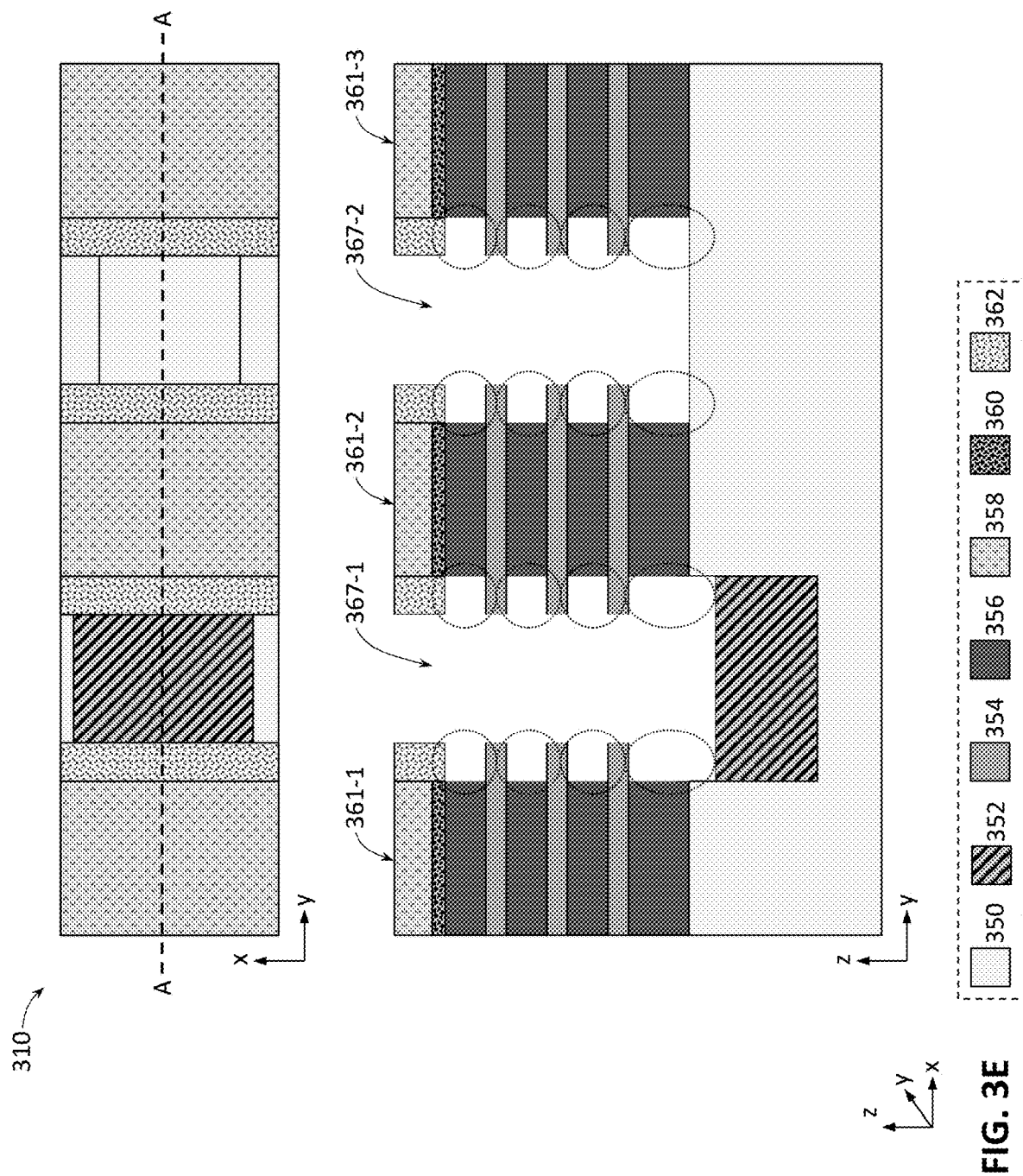
Figure 3F:
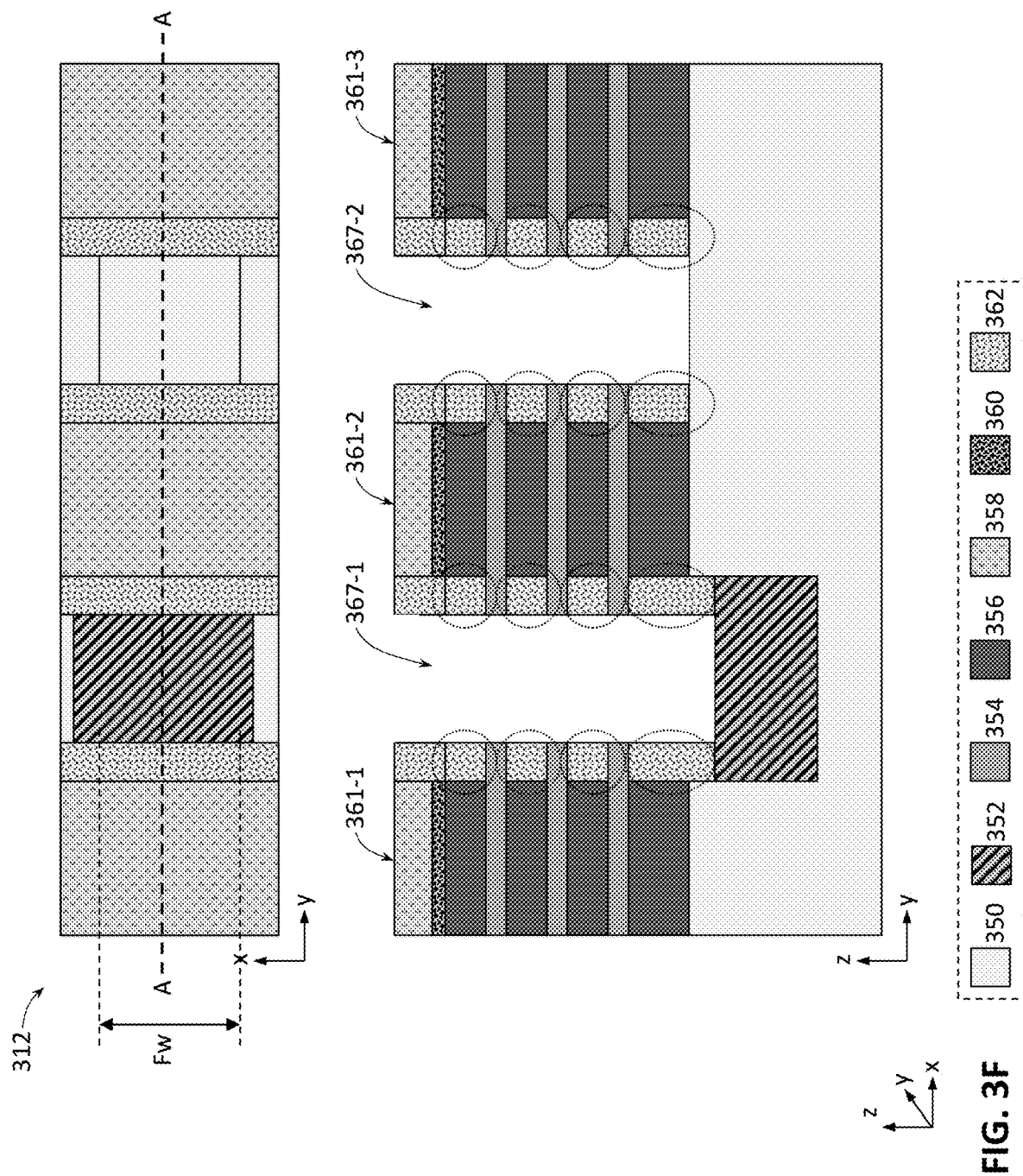
Figure 3G:
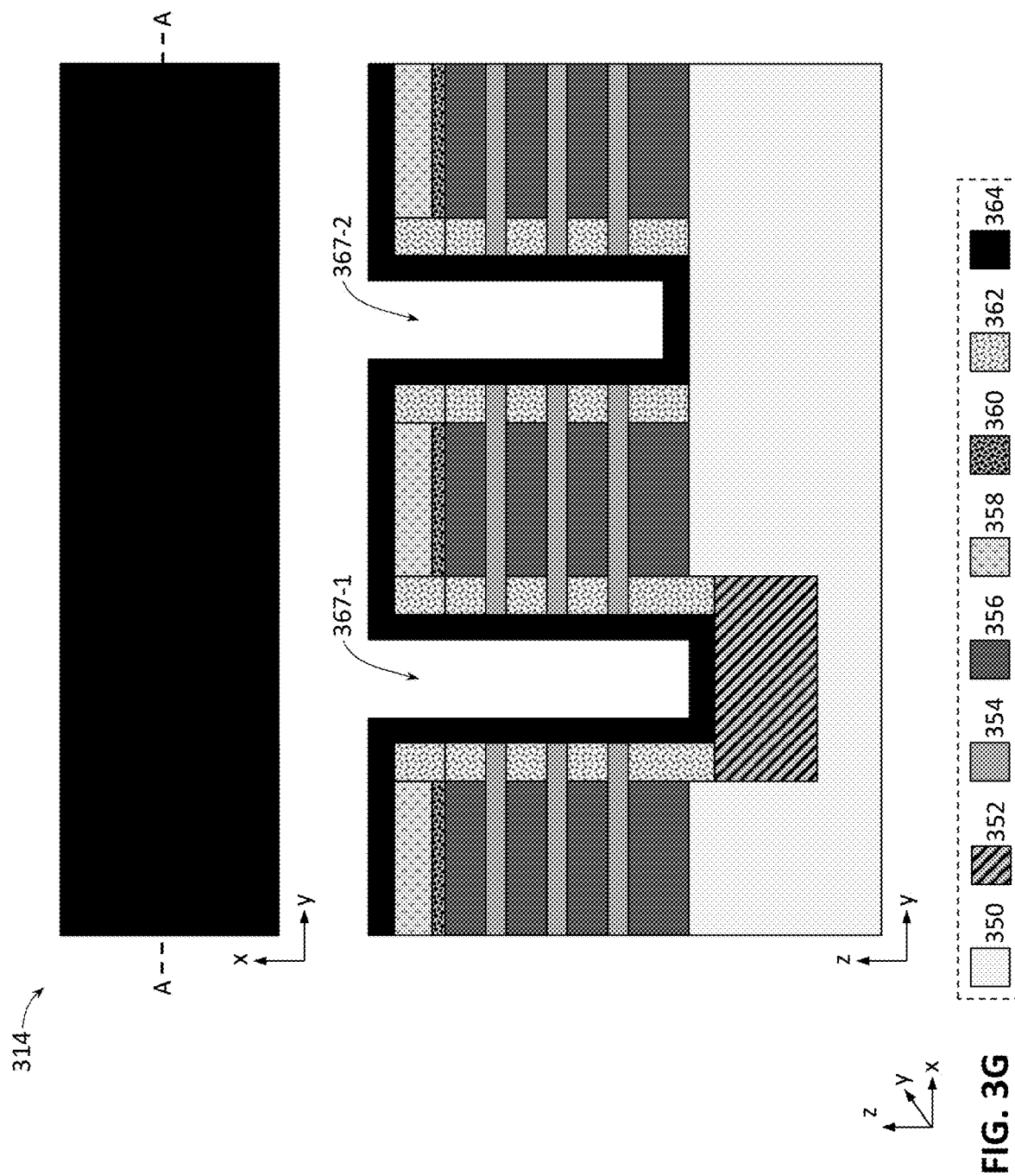
Figure 3H:
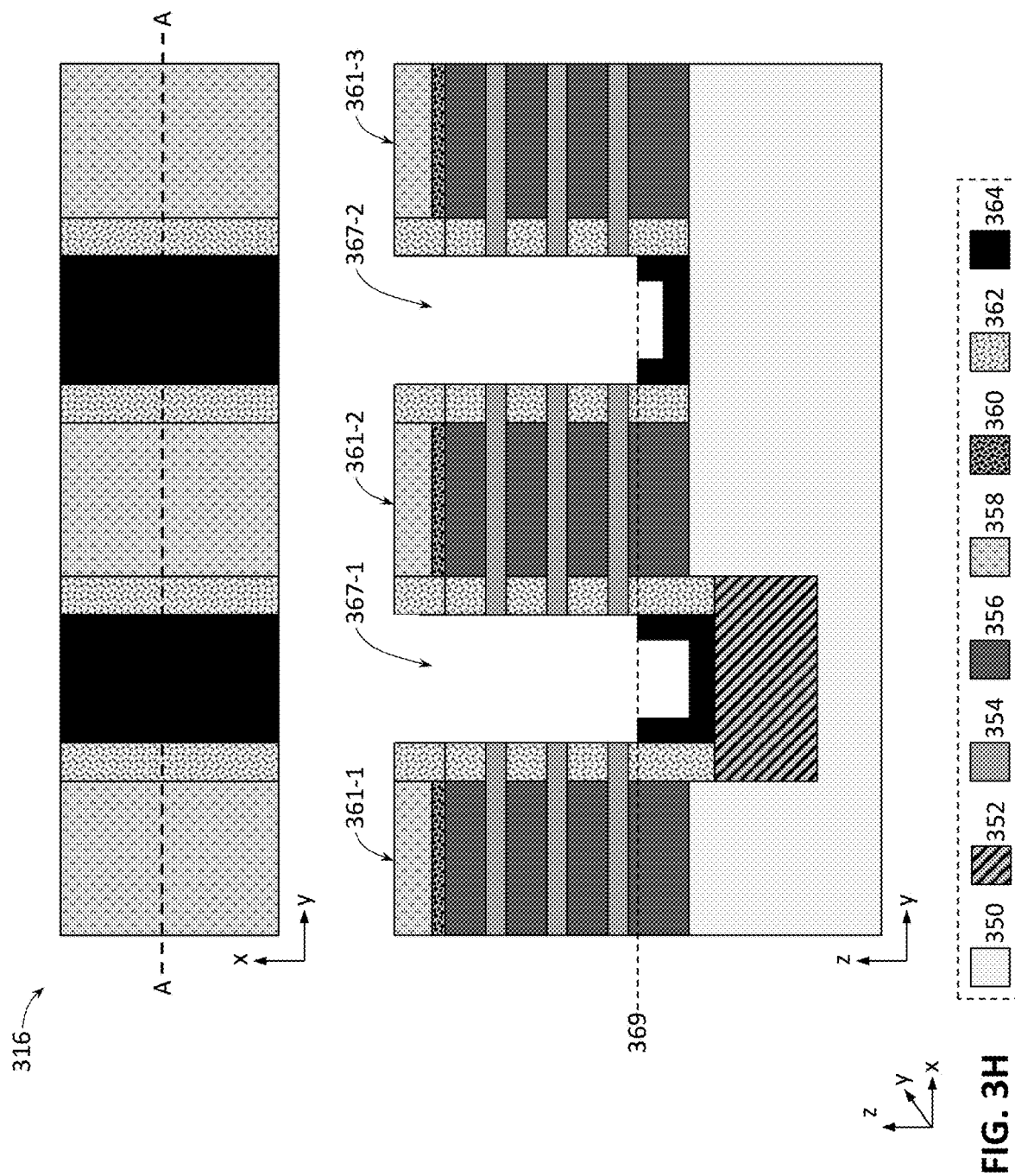
Figure 31:
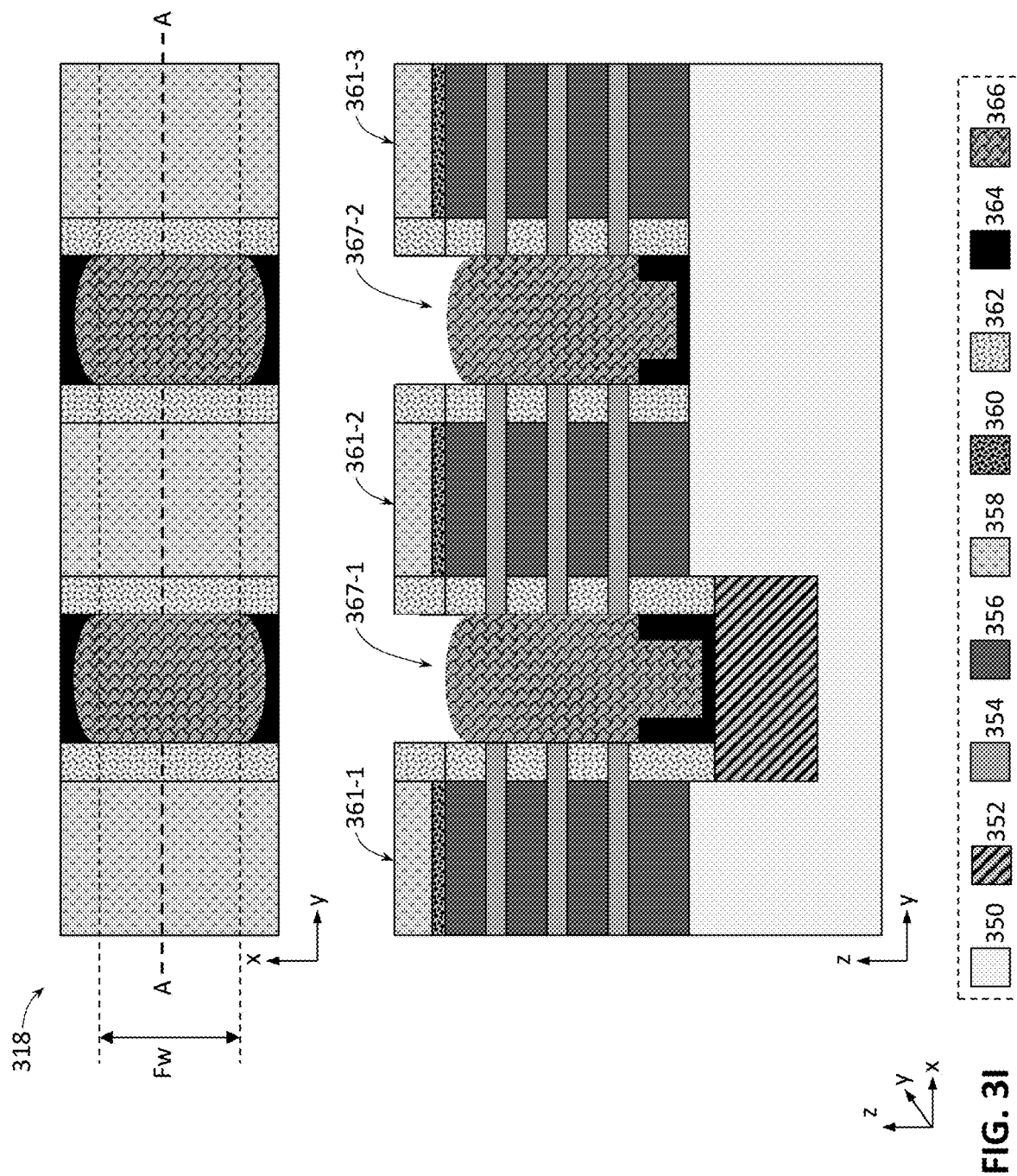
Figure 3J:
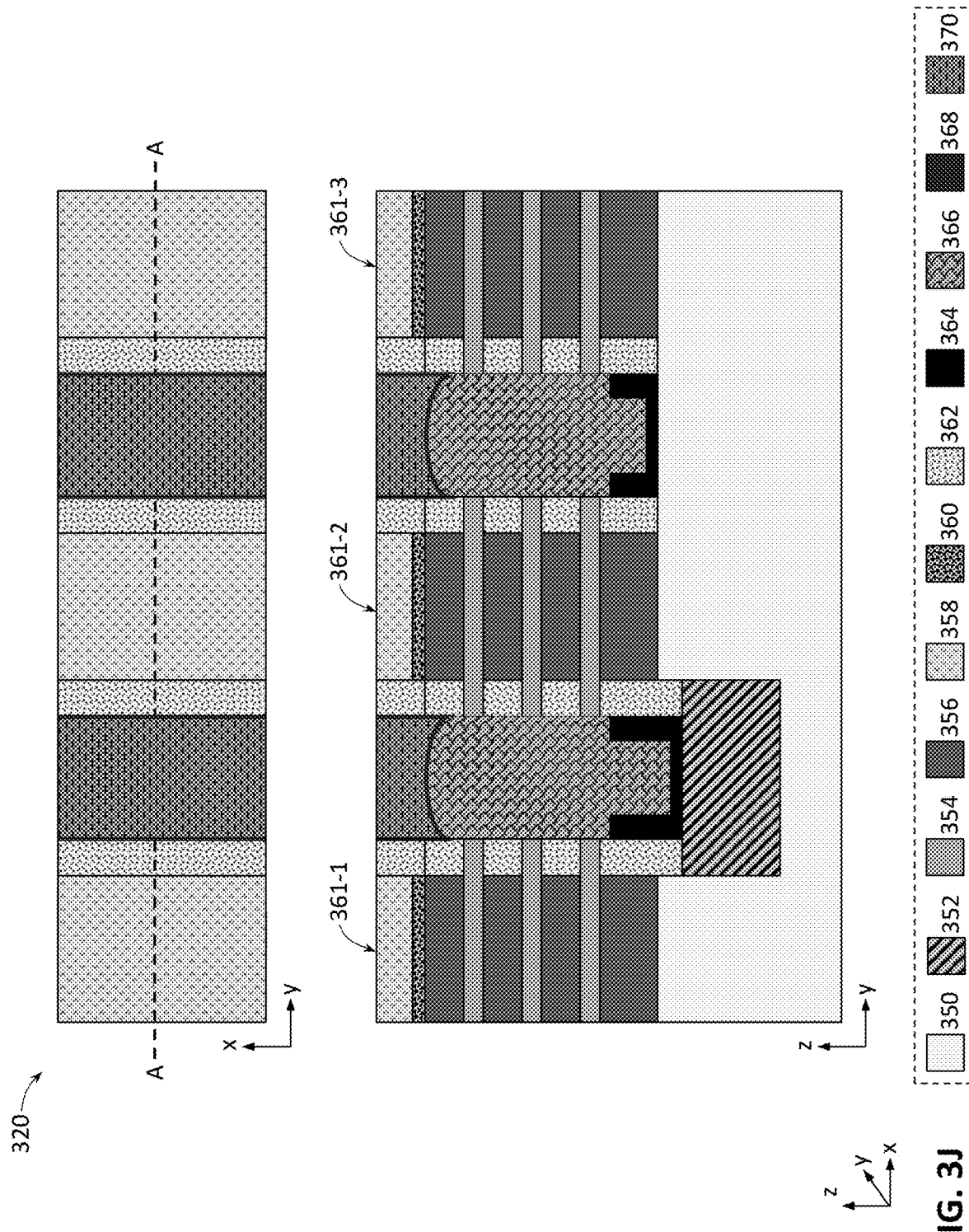
Figure 3K:
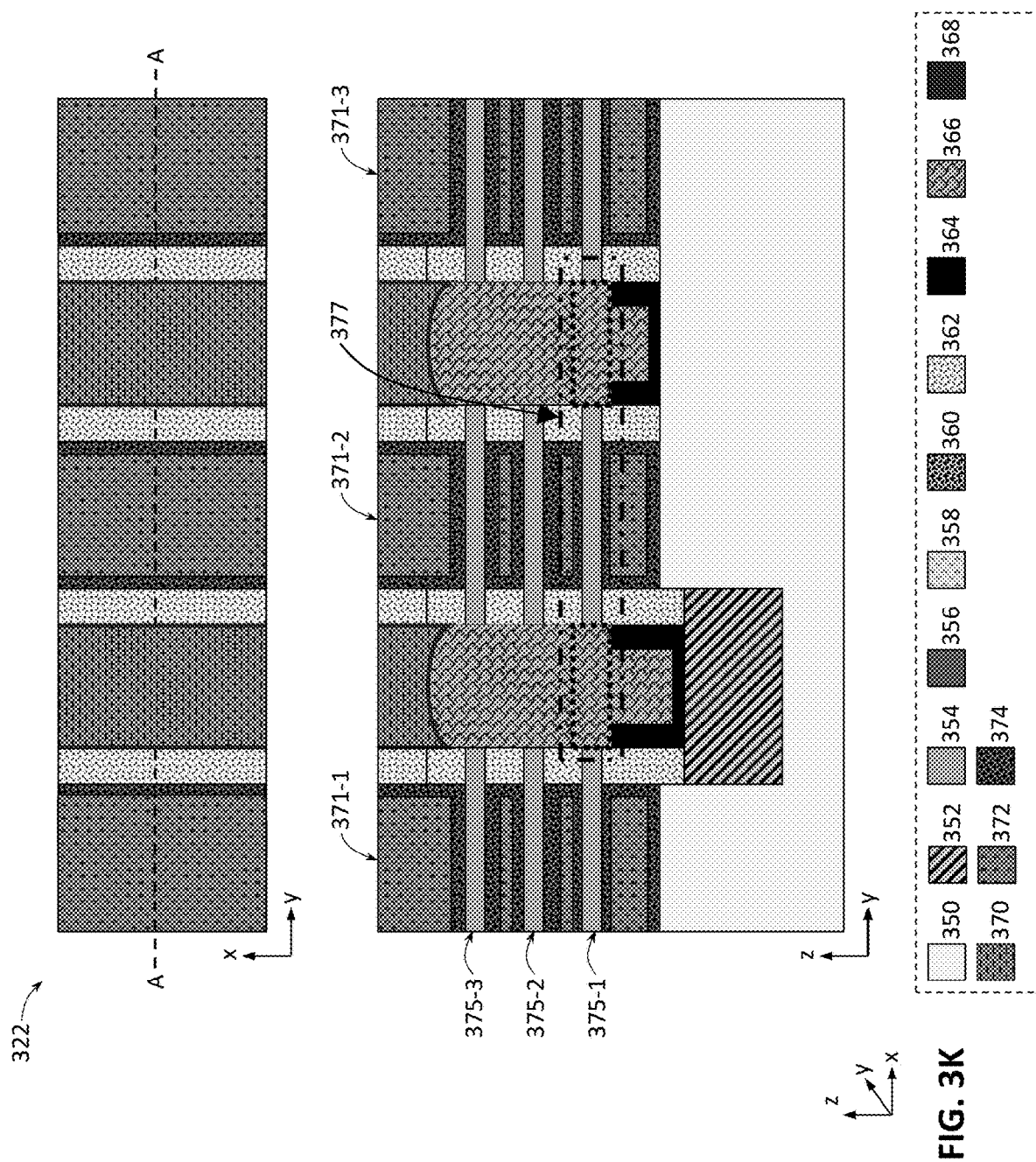
Figure 3L:
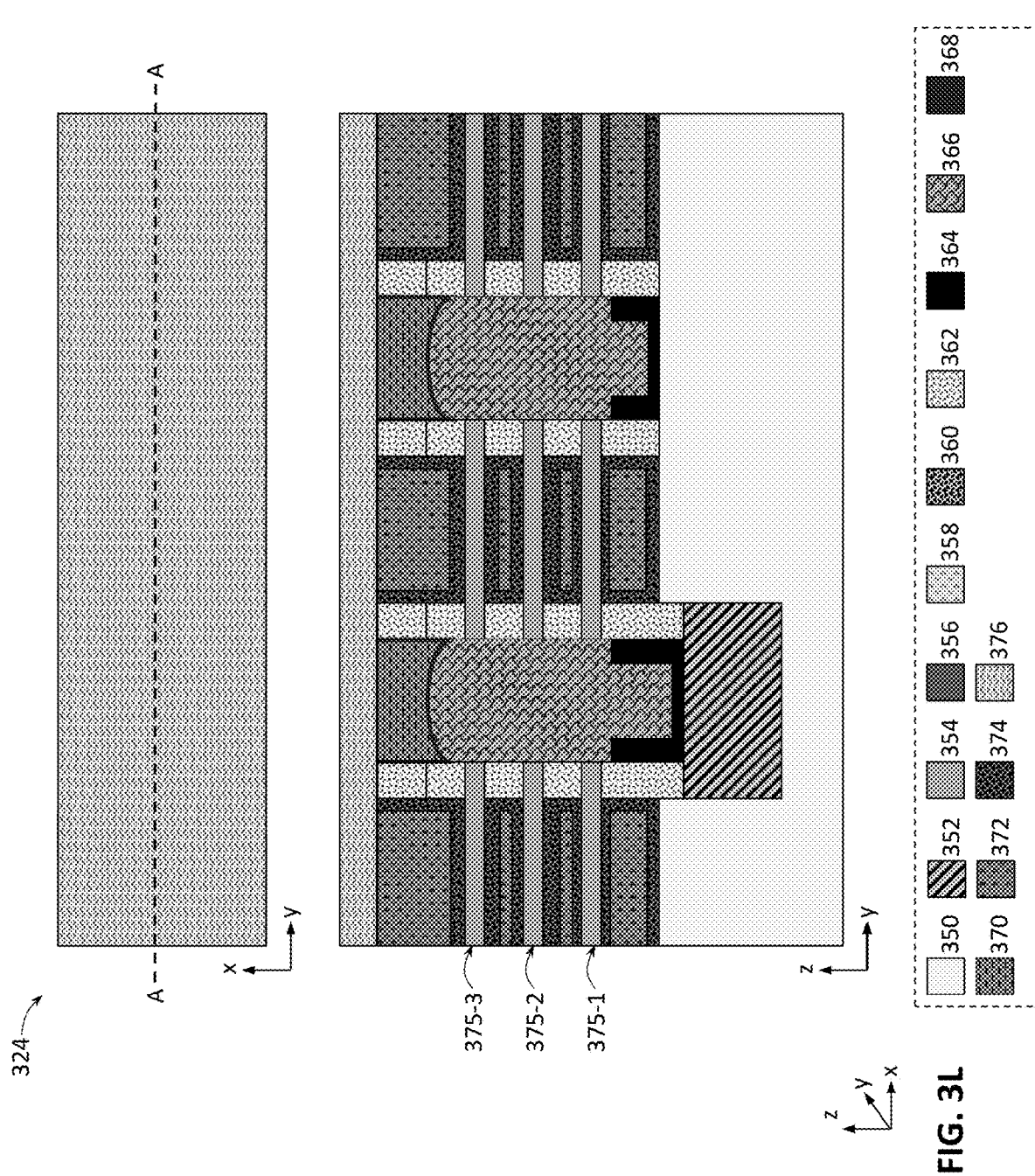
Figure 3M:
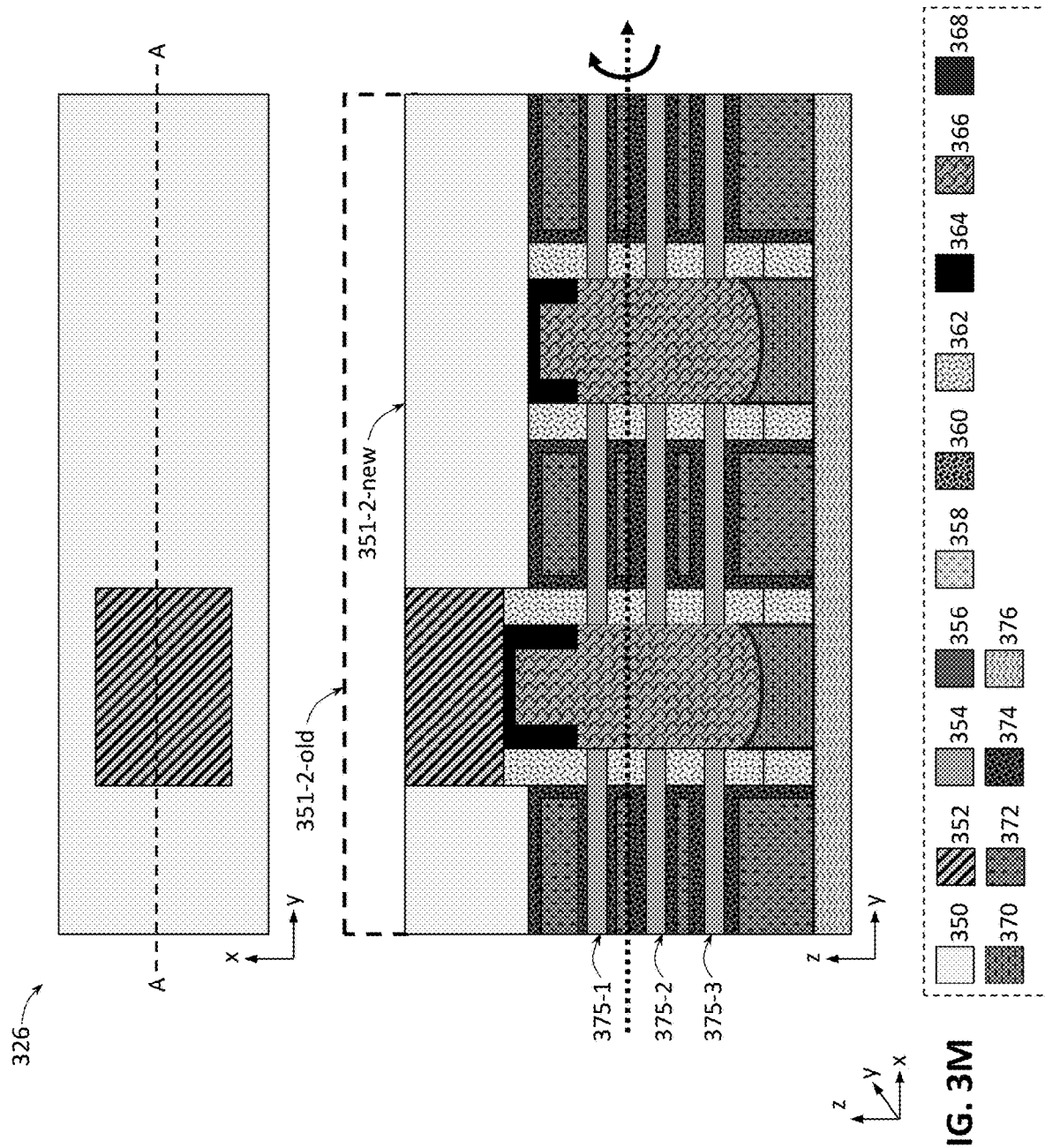
Figure 3N:
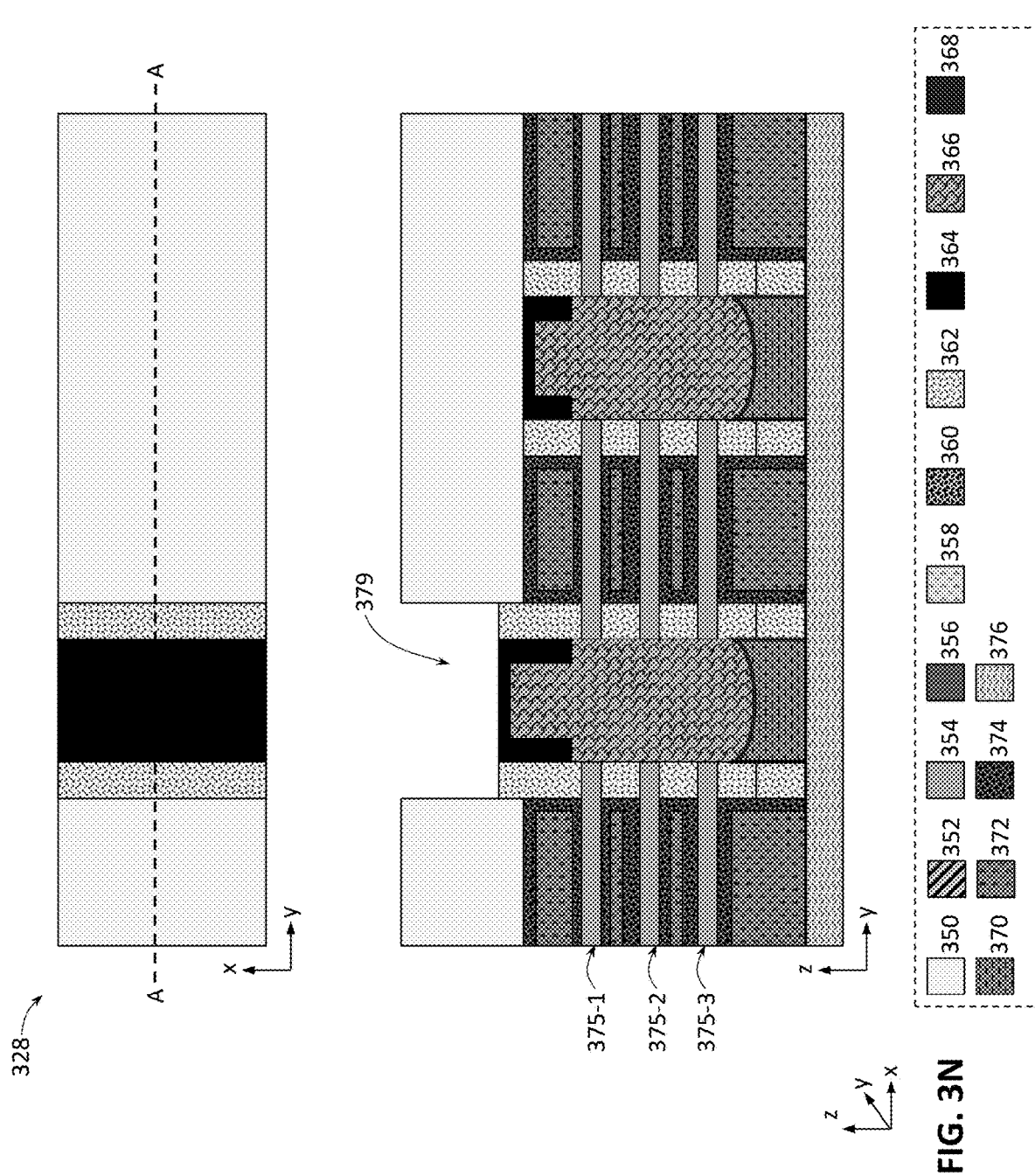
Figure 3O:
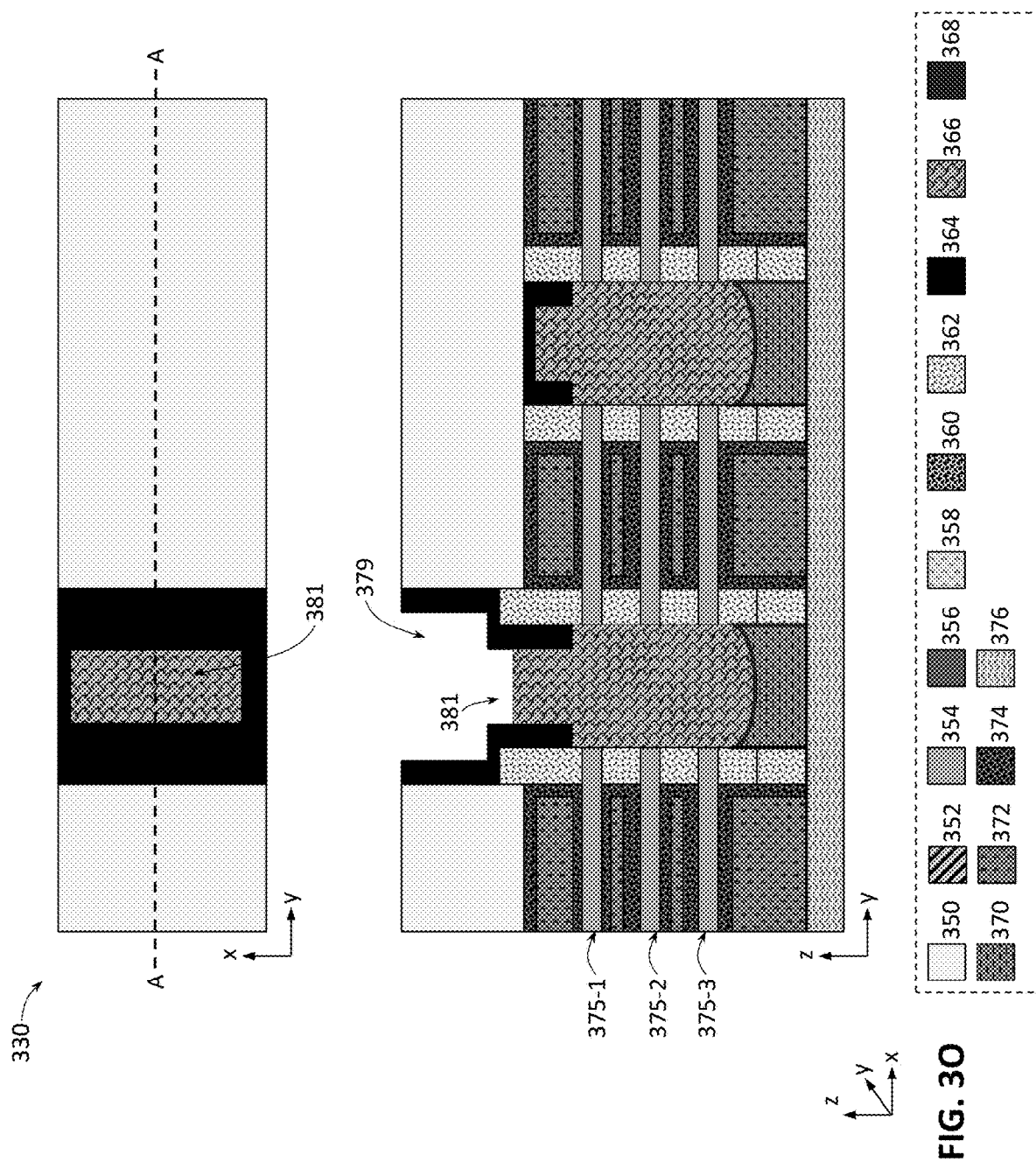
Figure 3P:
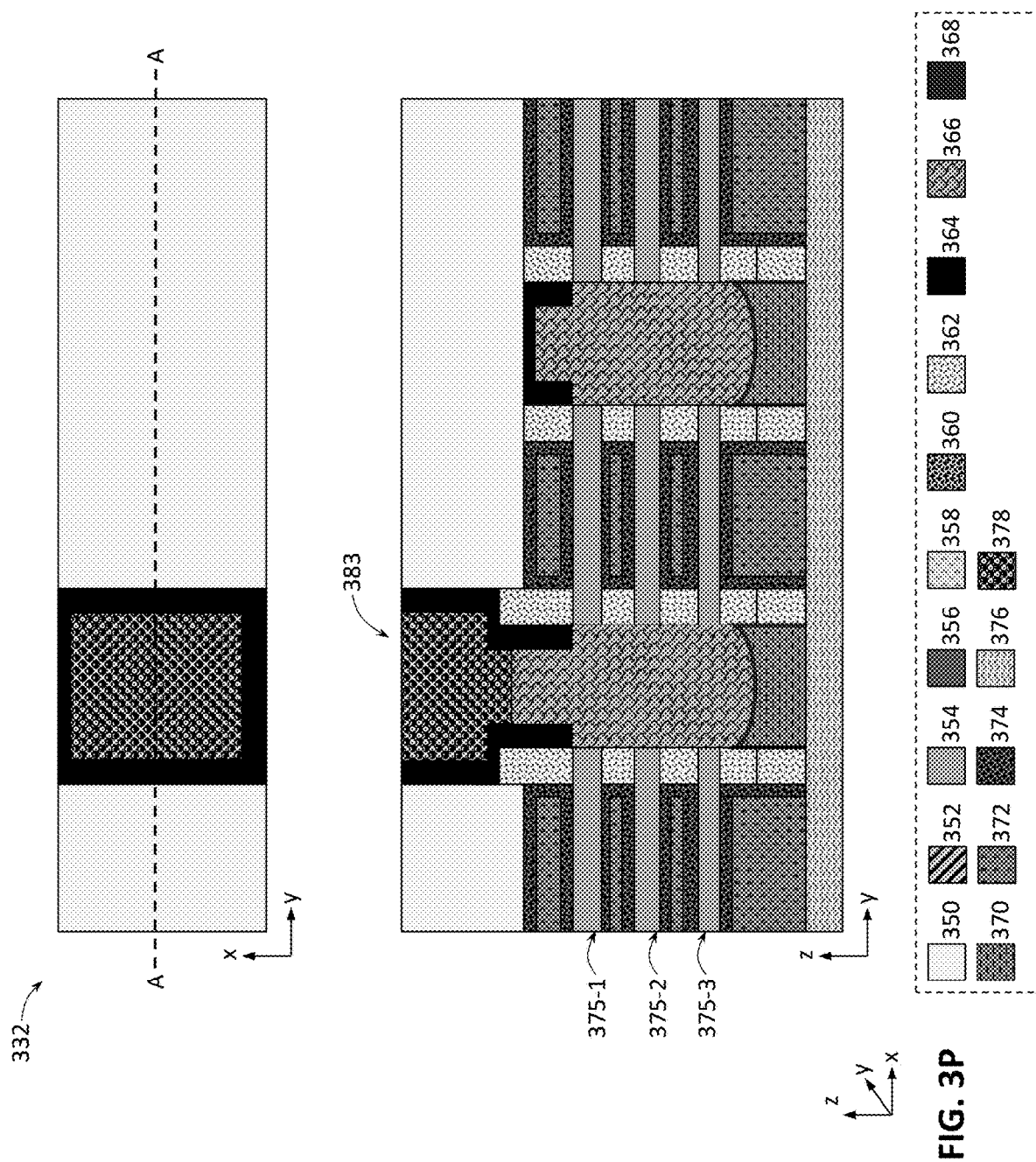
Figure 3R:
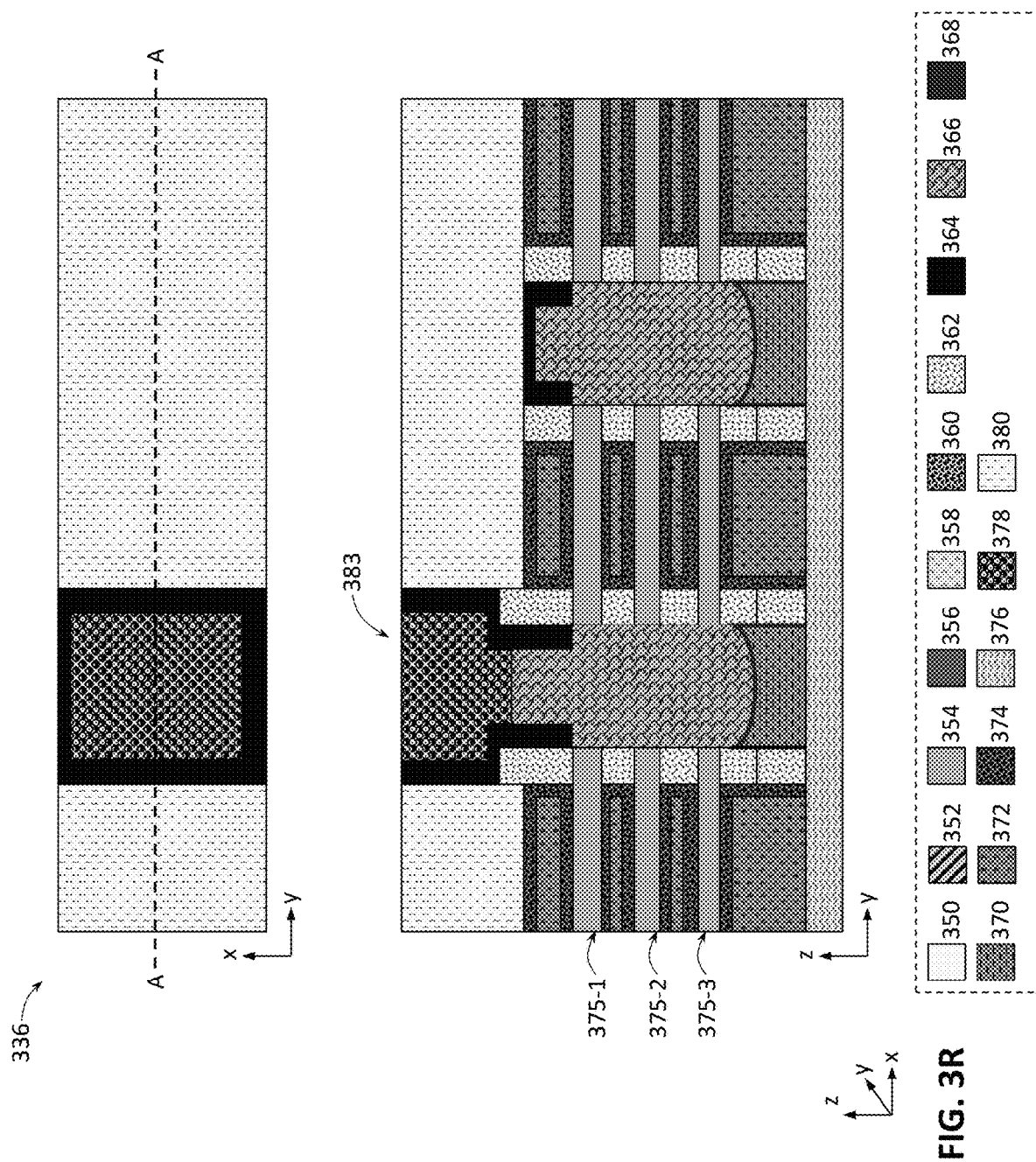
Figure 3S:
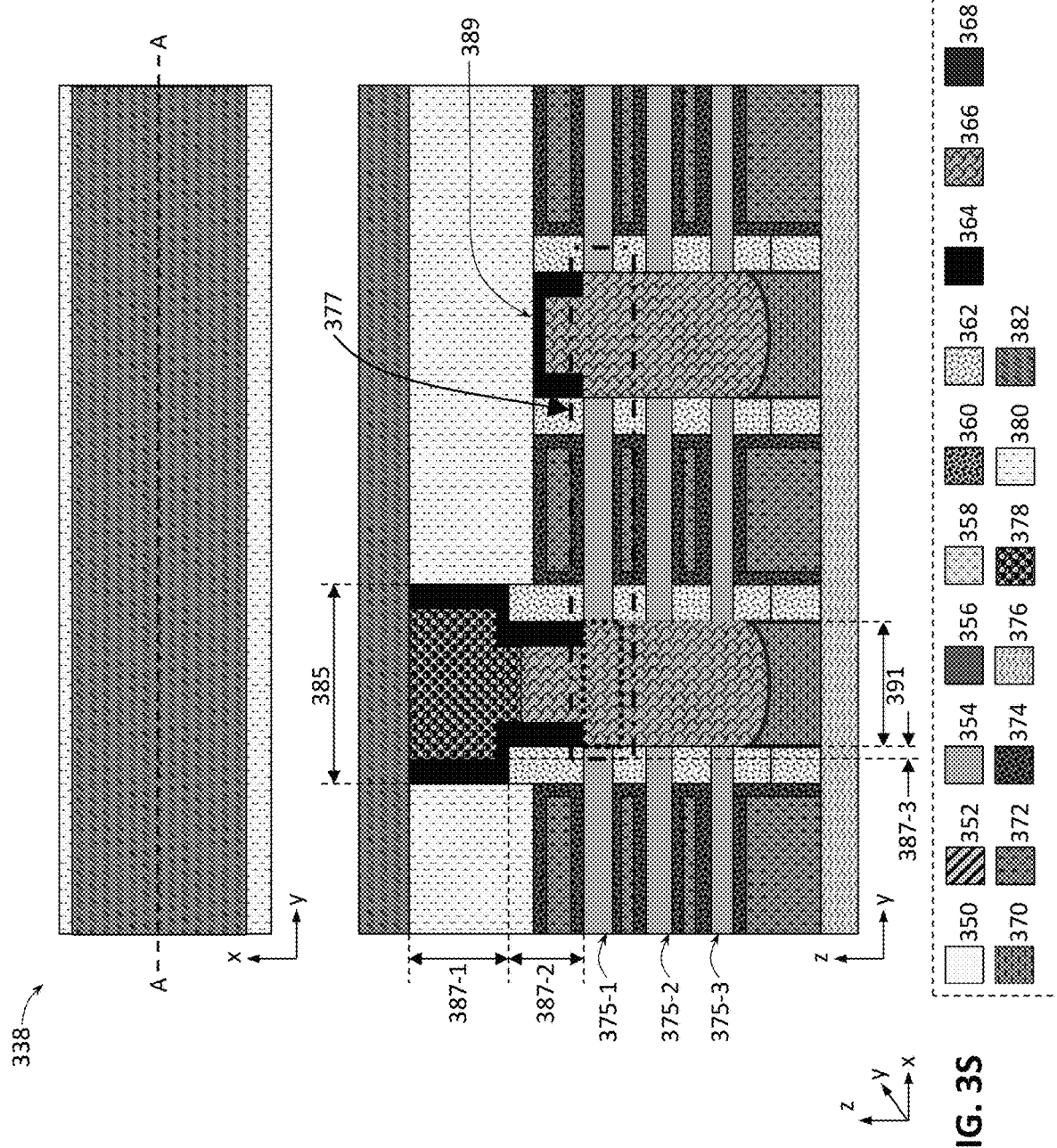

FIGS. 3A-3S provide top-down and cross-sectional side views at various stages in the manufacture of an example nanoribbon-based transistor arrangement with a backside S/D contact according to the method 200 of FIG. 2, in accordance with some embodiments. FIGS. 4A-4E provide top-down and cross-sectional side views at various stages in the manufacture of an example nanoribbon-based transistor arrangement with a backside gate contact according to the method 200 of FIG. 2, in accordance with some embodiments. Each of FIGS. 3A-3S and FIGS. 4A-4E provides a top-down view (i.e., a view in the x-y plane of the example coordinate system shown in FIGS. 1, 3, and 4) and a cross-sectional side view (i.e., a view in the y-z plane of the example coordinate system shown in FIGS. 1, 3, and 4) of the respective transistor arrangements. The cross-sectional side views shown in FIGS. 3 and 4 illustrate the cross-section taken along a plane AA shown with a dashed line in some of the top-down views (e.g., shown in FIG. 3A), where the plane AA is a plane that is substantially perpendicular to the page of the drawing and includes the dashed line shown in the top-down view of, e.g., FIG. 3A.

A number of elements referred to in the description of FIGS. 3A-3S and FIGS. 4A-4E with reference numerals are illustrated in these figures with different patterns, with a legend showing the correspondence between the reference numerals and patterns being provided at the bottom of each drawing page containing FIGS. 3A-3S and FIGS. 4A-4E. For example, the legend illustrates that FIGS. 3A-3S and FIGS. 4A-4E use different patterns to show a support structure 350, a placeholder material 352, a first semiconductor material 354, and so on. Furthermore, although a certain number of a given element may be illustrated in some of FIGS. 3A-3S and FIGS. 4A-4E (e.g., one stack of nanoribbons 375, with three nanoribbons 375 in the stack), this is simply for ease of illustration, and more, or less, than that number may be included in other transistor arrangements fabricated using a placeholder for backside contact formation according to various embodiments of the present disclosure. Still further, various views shown in FIGS. 3A-3S and FIGS. 4A-4E are intended to show relative arrangements of various elements therein, and that various transistor arrangements fabricated using a placeholder for backside contact formation, or portions thereof, may include other elements or components that are not illustrated (e.g., transistor portions, various components that may be in electrical contact with any of the transistor portions, etc.).

The method 200 may begin with a process 202 that includes providing an opening for a placeholder for a backside contact at a front side of a support structure, and providing a placeholder material within the opening, recessed at the top. An IC structure 302 of FIG. 3A illustrates an example result of performing the process 202.

As shown in FIG. 3A, the IC structure 302 includes a support structure 350 that includes a first face 351-1 an opposite second face 351-2. The first face 351-1 may be considered to be the "front side" of the support structure 350, while the second face 351-2 may be considered to be the "back side" of the support structure 350. FIG. 3A further illustrates an opening 353 in the first face 351-1, which opening extends towards but does not reach the second face 351-2 of the support structure 350. FIG. 3A also illustrates a placeholder material 352 within the opening 353, the placeholder material 352 being recessed by a distance 355 with respect to the first face 351-1 of the support structure 350.

In various embodiments, the support structure 350 may be the support structure 102, described above, while the placeholder material 352 may be, e.g., a dielectric material such as any of the dielectric materials described above with reference to the ILD materials. In some embodiments, the placeholder material 352 may be a material that is sufficiently etch-selective with respect to some other materials used in further processes of the method 200, e.g., with respect to the spacer material 362 and/or with respect to the liner dielectric material 364. As known in the art, two materials are said to have "sufficient etch selectivity" when etchants used to etch one material do not substantially etch the other, enabling selective etching of one material but not the other.

In various embodiments, any suitable patterning techniques may be used in the process 202 to form the opening 353 to define the location and the geometry of the opening 353, possibly in conjunction with a suitable etching technique to remove a portion of the support structure 350 in the location and the geometry defined by the patterning process. The patterning techniques that may be used in the process 202 include, but are not limited to, photolithographic or electron-beam (e-beam) patterning. The etching techniques that may be used in the process 202 include, but are not limited to, a dry etch, such as e.g., radio frequency (RF) reactive ion etch (RIE) or inductively coupled plasma (ICP) RIE. In some embodiments, the etch performed in the process 202 to form the opening 353 may include an anisotropic etch, using etchants in a form of, e.g., chemically active ionized gas (i.e., plasma) using e.g., bromine (Br) and chloride (CI) based chemistries. In some embodiments, during the etch of the process 202, the IC structure may be heated to elevated temperatures, e.g., to temperatures between about room temperature and 200 degrees Celsius, including all values and ranges therein, to promote that byproducts of the etch are made sufficiently volatile to be removed from the surface.

The placeholder material 352 may be deposited into the opening 353 using any suitable process such as spin-coating, dip-coating, atomic layer deposition (ALD), chemical vapor deposition (CVD), physical vapor deposition (PVD) (e.g., evaporative deposition, magnetron sputtering, or e-beam deposition), etc., possibly in combination with a polishing process to remove excess of the placeholder material 352 from the front side of the support structure 350. A timed etch may be used to recess the placeholder material 352 by the distance 355. In some embodiments, the distance 355 may be between about 2 and 50 nanometers, including all values and ranges therein.

The method 200 may further include a process 204, which includes providing a stack of alternating layers of first and second semiconductor materials over the support structure with the placeholder material. An IC structure 304 of FIG. 3B illustrates an example result of performing the process 204.

As shown in FIG. 3B, the IC structure 304 may include alternate layers of a first semiconductor material 354 and a second semiconductor material 356 forming a stack 357. As also shown in FIG. 3B, in some embodiments, the alternation of layers of the first semiconductor material 354 and the second semiconductor material 356 may begin after, first, a base of the second semiconductor material 356 is provided over the support structure 350 and, in particular, over the recess in the placeholder material 352. Providing the alternate layers of the first semiconductor material 354 and the second semiconductor material 356 in the process 204 may include epitaxially growing layers of the first semiconductor material 354 and the second semiconductor material 356 using any of the techniques known in the art. In some embodiments, a process known as "epitaxial lateral overgrowth" (ELO) may be used to provide the second semiconductor material 356 in the recess in the placeholder material 352. Thickness of the first semiconductor material 354 (i.e., a dimension measured in the direction of the z-axis) may be as that described above with respect to the nanoribbon 104. Thickness of the second semiconductor material 356 may be any thickness suitable to provide the gate stacks (e.g., the gate stacks 106, described above) around the future nanoribbons of the first semiconductor material 354.

In various embodiments, the first semiconductor material 354 may be the channel material described with reference to the nanoribbon 104, described above. The second semiconductor material 356 may be any suitable material that is sufficiently etch-selective with respect to the first semiconductor material 354 in order to be able to etch, in a later process, the second semiconductor material 356 to form nanoribbons of the first semiconductor material 354. For example, in some embodiments, the first semiconductor material 354 may be silicon while the second semiconductor material 356 may be silicon germanium.

The method 200 may then proceed with a process 206, which includes patterning the stack formed in the process 204 to form, over the opening with the placeholder material, a fin from which the nanoribbons of the nanoribbon-based transistor arrangement may later be formed, and patterning active regions in the fin by defining locations of the gates for the future nanoribbon-based transistors. An IC structure 306 of FIG. 3C illustrates an example result of performing the process 206.

FIG. 3C illustrates that the stack 357 has been shaped to form a fin 359 of the IC structure 306. The fin 359 may be shaped as a structure that extends away from the support structure 350, and having a width Fw (i.e., a dimension measured along the x-axis of the example coordinate system shown), which may be as described above with reference to the width of the nanoribbon 104. The fin 359 may further have a length (i.e., a dimension measured along the y-axis of the example coordinate system shown) suitable to account for the length of the future nanoribbons (e.g., as described above with reference to the length of the nanoribbon 104).

In various embodiments, any suitable patterning techniques, possibly in conjunction with a suitable etching technique, may be used in the process 206 to form the fin 359, such as patterning and etching techniques described above. The fin 359 is supposed to be provided over the opening 353 with the placeholder material 352. However, because the fin 359 is not self-aligned to the opening 353, there may be some misalignment of the fin 359 with respect to the opening 353. This is illustrated in FIG. 3C with sidewalls 365 of the fin 359 (i.e., the two confinement surfaces of the fin 359 in two different y-z planes) ending up at different distances from the respective y-z plane sidewalls 363 of the opening 353. In other words, in various embodiments, the distance between the first sidewall 365-1 of the fin 359 and the first sidewall 363-1 of the opening 353 may be different than the distance between the second sidewall 365-2 of the fin 359 and the second sidewall 363-2 of the opening 353.

FIG. 3C further illustrates dummy gates 361 provided over portions of the fin 359, at a distance from one another. The example of the IC structure 306 illustrates 3 dummy gates 361, shown as dummy gates 361-1, 361-2, and 361-3, each of which may include a dummy gate electrode material 358, wrapping around a portion of the fin 359. In some embodiments, each of the dummy gates 361 may also include a dummy gate dielectric material 360, provided between the dummy gate electrode material 358 and the fin 359. Each of the dummy gate dielectric material 360 and the dummy gate electrode material 358 may conformally wrap around portions of the fin 359 where future gate stacks of the transistors are to be provided, thus defining locations for active regions of one or more transistors along a single fin.

FIG. 3C also illustrates a spacer material 362 provided on sides of the dummy gates 361 that face one another. The spacer material 362 may be a dielectric material such as any of the dielectric materials described above with reference to the ILD materials, e.g., any of the low-k dielectric materials described above.

The tow-down view of FIG. 3C is slightly larger in the x-axis direction than other top-down views shown in the present drawings in order to illustrate how the fin 359 may be arranged to occupy a portion of the support structure 350 and how the dummy gates 361 and the spacer material 362 may conformally wrap around the fin 359. In some embodiments, each of the dummy gate dielectric material 360, the dummy gate electrode material 358, and the spacer material 362 may be provided in the process 206 using any suitable techniques for depositing (e.g. gapfill deposition, i.e., non-conformal) dielectric materials onto selected surfaces, such as ALD, CVD, plasma enhanced CVD (PECVD), or/and PVD processes such as e.g. sputter.

It should be noted that, while FIG. 3C illustrates possible misalignment between the fin 359 and the opening 353 in the direction of the x-axis, there may also be a misalignment between the locations of the dummy gates 361 and the sidewalls of the opening 353 in the direction of the y-axis. The latter misalignment is not specifically shown in FIG. 3C in order to not clutter the drawings, and the sidewalls of the dummy gates 361-1 and 361-2 are illustrated to be aligned with the corresponding x-z plane sidewalls of the opening 353. However, in other embodiments, the x-z plane sidewalls of the dummy gates 361-1 and 361-2 may be slightly misaligned, e.g., be at different distances, with the corresponding x-z plane sidewalls of the opening 353.

The method 200 may further include a process 208, which includes removing the first and second semiconductor materials of the stack provided in the process 204 in regions not protected by the dummy gates and the gate spacers provided in the process 206. An IC structure 308 of FIG. 3D illustrates an example result of performing the process 208.

As shown in FIG. 3D, the IC structure 308 may include a first opening 367-1, formed by removal of the first and second semiconductor materials 354, 356 in a region of the fin 359 between opposite sidewalls of the spacer material 362 provided over the dummy gates 361-1 and 361-2 (i.e., opposite x-z plane sidewalls of the spacer material 362). Similarly, the IC structure 308 may include a second opening 367-2, formed by removal of the first and second semiconductor materials 354, 356 in a region of the fin 359 between opposite sidewalls of the spacer material 362 provided over the dummy gates 361-2 and 361-3 (i.e., opposite x-z plane sidewalls of the spacer material 362).

Any suitable etch process, which may include a combination of etch processes using different etchants, may be used to form the openings 367-1 and 367-2 in the process 208. For example, in some embodiments, the process 208 may include a combination of anisotropic etches to remove alternate stack of the first and second semiconductor materials 354, 356 not covered by the dummy gates 361 and the spacer material 362. Because the first and second semiconductor materials 354, 356 are sufficiently etch-selective with respect to one another, in some embodiments of the process 208, different etchants may be used in an alternating fashion. In other embodiment, etchants that can etch both the first and second semiconductor materials 354, 356 may be used.

For the opening 367-1, the etch of the process 208 may substantially stop once the placeholder material 352 is revealed (e.g., if the placeholder material 352 is sufficiently etch-selective with respect to the etchants used to remove the first and second semiconductor materials 354, 356). For the opening 367-2, although the embodiment of FIG. 3D illustrates that the etch of the process 208 may substantially stop once the support structure 350 is revealed, in other embodiments of the IC structure 308 (and the subsequent IC structures shown in FIG. 3 and FIG. 4), the opening 367-2 may be etched into the support structure 350. For example, in some embodiments, the depths of the openings 367-1 and 367-2 (i.e., a dimension measured along the z-axis) may be substantially the same.

The method 200 may then proceed with a process 210, which includes recessing the second semiconductor material through the openings formed in the process 208. An IC structure 310 of FIG. 3E illustrates an example result of performing the process 210.

In some embodiments, the process 210 may include performing a time-controlled selective etch to recess the second semiconductor material 356 through the openings 367. Areas where the second semiconductor material 356 may be recessed are indicated in FIG. 3E with dotted circles/ovals. Thus, the IC structure 310 illustrates that, in some embodiments, portions of the second semiconductor material 356 that are substantially within the spacer material 362 may be removed. The process of removing the second semiconductor material 356 in these portions is known in the art as a "dimple etch" or an "inner spacer recess" process, and may be performed as a part of a conventional gate-all-around flow used for nanoribbon-based transistors.

The method 200 may then proceed with a process 212, which includes depositing a spacer material in regions where the second semiconductor material was recessed in the process 210. An IC structure 312 of FIG. 3F illustrates an example result of performing the process 212.

Although the IC structure 312 is shown to include the spacer material 362 provided in the recesses of the process 210 (shown in FIG. 3F to be within the dotted circles/ovals, similar to the illustration of FIG. 3E), in other embodiments, the dielectric material provided in the recesses formed in the process 210 and the spacer material 362 deposited on either side of the dummy gates 361 in the process 206 may have different material compositions. Each of these dielectric materials may be a dielectric material such as any of the dielectric materials described above with reference to the ILD materials, e.g., a low-k dielectric material.

In some embodiments, the process 212 may include depositing the dielectric material to fill the openings 367, which will also fill the recesses formed in the process 210, and then performing an anisotropic etch to remove the dielectric material from the opening 367 while leaving it in the recesses under the spacer material 362 provided in the process 206.

Next, the method 200 may include a process 214, which includes conformally depositing a liner dielectric material 364 over the IC structure that was formed after the process 212. An IC structure 314 of FIG. 3G illustrates an example result of performing the process 214. The liner dielectric material 364 may be deposited using any suitable conformal deposition processes to deposit the material over all surfaces of the IC structure 314 to provide the IC structure 316, shown in FIG. 3H. In some embodiments, a thickness of the liner dielectric material 364 at the sidewalls of the openings 367 (e.g., a dimensioned measured along the y-axis) may be between about 1 and 20 nanometers, including all values and ranges therein, e.g., between about 2 and 10 nanometers or between about 3 and 8 nanometers. This may also be the thickness of the liner dielectric material 364 at other surfaces of the IC structure 316.

Looking ahead, the liner dielectric material 364 may be selected to be different from a replacement dielectric material 380 to be deposited around the backside contact in a process 218. Furthermore, in some embodiments, the replacement dielectric material 380 may have similar or substantially the same material composition and properties as the spacer material 362, in which case the differences between the liner dielectric material 364 and the replacement dielectric material 380, described below, are also applicable to the differences between the liner dielectric material 364 and the spacer material 362.

In some embodiments, the liner dielectric material 364 may be any dielectric material having a higher dielectric constant than that of the replacement dielectric material 380, but lower than about 6. For example, the liner dielectric material 364 may include materials such as silicon dioxide or carbon-doped silicon dioxide. Having a dielectric constant that is higher than that of the replacement dielectric material 380, but lower than about 6 differentiates the liner dielectric material 364 from common barrier materials used as diffusion barriers at sidewalls of conventional vias because such barrier materials are either metal nitrides such as titanium nitride or tantalum nitride (i.e., not dielectric materials) and/or dielectric materials such as aluminum nitride or silicon nitride that have dielectric constants of about 8.3 and 7.5, respectively. In some embodiments, the dielectric constant of the liner dielectric material 364 may be between about 3.5 and about 5.5. On the other hand, the dielectric constant of the replacement dielectric material 380 may be below about 3.5. For example, a classic low-k material such as organosilicate glass, which may be used as the replacement dielectric material 380, typically has a dielectric constant of about 3.0.

The difference in dielectric constants may not be the only parameter that differentiates the liner dielectric material 364 and the replacement dielectric material 380. In some embodiments, these two materials may also differ in their respective densities. In particular, the density of the liner dielectric material 364 may be higher than the density of the replacement dielectric material 380. For example, in some embodiments, the density of the replacement dielectric material 380 may be lower than about 1.8 gram per cubic centimeter ($g/cm^3$). For example, a classic low-k material such as organosilicate glass may have a density of about 1.4 $g/cm^3$. In another example, in some embodiments, the density of the liner dielectric material 364 (e.g., silicon oxide) may be higher than about 1.8 $g/cm^3$. For example, the density of the liner dielectric material 364 may be between about 1.8 $g/cm^3$ and 3 $g/cm^3$, including all values and ranges therein, e.g., between about 1.9 $g/cm^3$ and 2.9 $g/cm^3$, or between about 1.9 $g/cm^3$ and 2.5 $g/cm^3$.

The method 200 may also include a process 216, which includes recessing the liner dielectric material provided in the process 214. An IC structure 316 of FIG. 3H illustrates an example result of performing the process 216.

A line 369, shown in FIG. 3H, illustrates how deep the liner dielectric material 364 is recessed in the openings 367. As shown in FIG. 3H, in some embodiments, all of the liner dielectric material 364 is removed from the horizontal upper surfaces of the IC structure 316, as well as from the sidewalls of the openings 367 above the recess line 369.

In some embodiments, the recess of the process 216 may be performed as follows. First, the openings 367 of the IC structure 314 of FIG. 3G may be filled with a mask material, such as e.g., an organic mask material such as carbon hard mask. Then the mask material may be etched anisotropically and selectively (i.e., so that the mask material is etched without substantially etching other materials of the IC structure) until the mask material is about at the target level for the recess line 369. After that, a short selective isotropic etch may be performed to remove the liner dielectric material 364 not covered by the mask material. In this case the etch is selective so that the liner dielectric material 364 is etched without substantially etching other materials of the IC structure. Finally, the remaining mask material may be removed, resulting in the IC structure as shown in FIG. 3H.

The method 200 may further include a process 218, which includes depositing a S/D material into the openings with the recessed liner dielectric material resulting from the process 216. An IC structure 318 of FIG. 3I illustrates an example result of performing the process 218.

As shown in FIG. 3I, the IC structure 318 may include a S/D material 366 deposited into the openings 367 of the IC structure 316. In some embodiments, an epitaxial deposition process may be performed to provide the S/D material 366, as was described above for some embodiments of the S/D regions 114, shown in FIG. 1. In some embodiments, the S/D material 366 may be a silicon alloy such as silicon germanium or silicon carbide. In some embodiments, the epitaxially deposited silicon alloy may be doped in situ with dopants such as boron, arsenic, or phosphorous. In further embodiments, the S/D material 366 may include one or more alternate semiconductor materials such as germanium or a group III-V material or alloy. And in further embodiments, one or more layers of metal and/or metal alloys may be used to form the S/D regions from the S/D material 366.

The top-down view of FIG. 3I illustrates the outline of the fin 359 (the sidewalls of the fin shown with the horizontal dashed lines at a distance of Fw from one another) under the S/D material 366. As this view illustrates, in some embodiments, the S/D material 366 may extend laterally beyond the actual borders of the fin 359.

The cross-sectional side view of FIG. 3I illustrates that, in some embodiments, as a result of a pre-clean process that may be carried out prior to performing the epitaxial deposition of the S/D region 366, the liner dielectric material 364 may become thinner at the bottom of the openings 367. For example, in some embodiments the thickness of the liner dielectric material 364 at the bottom of the openings 367 (a dimension measured along the z-axis) may be at least about 10% smaller, e.g., at least about 20% smaller or at least about 30% smaller, than the thickness of the liner dielectric material 364 that was initially deposited.

The method 200 may then proceed with a process 220, which includes depositing an etch-stop material over the S/D material provided in the process 218, and then filling the remainder of the openings with the S/D material with a dielectric material. An IC structure 320 of FIG. 3J illustrates an example result of performing the process 220.

As shown in FIG. 3J, the IC structure 320 may include an etch-stop material 368 deposited as a liner over the sidewalls and the bottom of the openings 367 partially filled with the S/D material 366, and then the remainder of the lined openings may be filled with a S/D fill dielectric material 370. In various embodiments, the etch-stop material 368 may include materials such as silicon nitride, or silicon carbon nitride, and may be deposited using any suitable conformal deposition technique. The S/D fill dielectric material 370 may be, e.g., a dielectric material such as any of the dielectric materials described above with reference to the ILD materials and may be deposited using a technique such as spin-coating, dip-coating, ALD, CVD, or PVD, possibly in combination with a polishing process, e.g., CMP, to remove excess of the S/D fill dielectric material 370 from the horizontal surfaces of the IC structure 320 other than in the openings 367.

Continuing with the illustration of the method 200 on FIG. 2B, the method 200 may further include a process 222, which includes performing a replacement metal gate (RMG) process to provide gate stacks around nanoribbons of the first semiconductor material. An IC structure 322 of FIG. 3K illustrates an example result of performing the process 222.

The process 222 may include, first, removing the dummy gates 361. Once the dummy gates 361 are removed, the second semiconductor material 356 that was previously covered by the dummy gates 361 becomes exposed and may, therefore, be removed, e.g., by performing selective etching to remove the second semiconductor material 356 without substantially etching other portions of the IC structure. As a result of removing the second semiconductor material 356 that was previously covered by the dummy gates 361, nanoribbons 375 of the first semiconductor material 354 are formed, labeled in FIG. 3K as nanoribbons 375-1, 375-2, and 375-3. Each of the nanoribbons 375 form basis for providing one or more nanoribbon-based transistors along its' length. Also as a result of removing the second semiconductor material 356 that was previously covered by the dummy gates 361, openings around each of the nanoribbons 375 may be formed in the gate portions (i.e., where the dummy gates 361 used to be), which openings may now be filled with a gate stack. Providing a gate stack in the process 222 may include providing a gate dielectric material 374 and a gate electrode material 372, thus forming a gate stack 371 around each portion of each of the nanoribbons 375 along a portion of the length of the nanoribbons 375 defined by where the dummy gates 361 used to be, as is shown in FIG. 3K. The gate dielectric material 372 may include any of the materials described with reference to the gate dielectric material 112, and the gate electrode material 374 may include any of the materials described with reference to the gate electrode material 108, described above. In some embodiments, providing the gate stack in the process 222 may include depositing a liner of the gate dielectric material 372 of the gate stacks 371 over exposed surfaces of the openings formed by removing the dummy gates 361 and the second semiconductor material 356 that was previously covered by the dummy gates 361, and, after the liner of the gate dielectric material 374 has been deposited, depositing the gate electrode material 372 (e.g., a workfunction metal to set the N-type or P-type gate workfunction) of the gate stack.

Processes 206-222, described above, may be seen as processes for forming one or more nanoribbons (namely, a stack of 3 nanoribbons 375 for the example shown in the present drawings) and then providing one or more transistors along some or all of the nanoribbons. One example nanoribbon-based transistor is labeled in FIG. 3K as a transistor 377, an approximate boundary of which is indicated with a dash-dotted contour. The transistor 377 is provided along the nanoribbon 375-1. Similar to the fin 359 from which the nanoribbon 375-1 was formed, the nanoribbon 375-1 has a long axis that is substantially parallel to the support structure 350 (e.g., having a long axis along the y-axis of the example coordinate system shown in the present drawings). A channel portion of the transistor 377 is a portion of the first semiconductor material 354 of the nanoribbon 375-1 that is wrapped (at least partially) by the gate stack 371-2. A first S/D region and a second S/D region of the transistor 377 are portions of the S/D material 366 provided on either side of the channel portion of the transistor 377, indicated in FIG. 3K as portions of the S/D material 366 within dotted contours shown on the opposite sides of the channel portion of the transistor 377.

Although not specifically labeled in FIG. 3K, similar transistors 377 are provided along the nanoribbons 375-2 and 375-3.

The method 200 may further include a process 224, which includes providing further front end of line (FEOL) and/or back end of line (BEOL) layers over the layer with the nanoribbon-based transistors formed in the process 222. An IC structure 324 of FIG. 3L illustrates an example result of performing the process 224.

The IC structure 324 illustrates a top layer 376 provided over the one or more nanoribbon-based transistors 377 formed in the process 222. The top layer 76 may include whatever other components may need to be provided on the front side of the support structure 350, provided according to known techniques, depending on the nature of the components. For example, in various embodiments, the top layer 376 may include additional transistors (e.g., thin-film transistors provided in the BEOL of the IC structure 324), metallization layers for providing electrical connectivity to/from/between various components and devices of the IC structure 324, a first-level interconnect layer for coupling the components and devices of the IC structure 324 to structures at other wafers (e.g., as described with reference to FIG. 6), as well as a carrier wafer bonded over all of the components and devices, the carrier wafer used to provide structural integrity in a further process of the method 200 when the support structure 350 is thinned down.

The method 200 may then proceed with a process 226, in which the IC structure with the nanoribbon-based transistors and further components and devices provided over the front side of the support structure is flipped over so that the back side of the support structure may be the working surface that may be processed, where the back side of the support structure is then thinned to expose/reveal the placeholder material that was provided in the process 202. An IC structure 326 of FIG. 3M illustrates an example result of performing the process 226.

A dotted arrow shown in the cross-sectional side view of FIG. 3M illustrates an axis over which the IC structure 324 may be flipped (rotated) to be arranged so that the back side 351-2 of the support structure 350 is facing upwards and may be processed. A dashed contour labeled "351-2-old" in the cross-sectional side view of FIG. 3M illustrates the original location of the back side 351-2 after the IC structure 324 is flipped over. In the IC structure 326 the back side 351-2 has been thinned to reveal the placeholder material 352, thus moving down with respect to the original location, the new location of the back side 351-2 labeled in FIG. 3M as "351-2-new."

In some embodiments, the back side 351-2 of the support structure 350 may be thinned using any suitable process, such as any suitable polishing process, such as CMP.

Next, the method 200 may include replacing the exposed placeholder material with a portion of a backside S/D contact. In some embodiments, this may be realized by performing processes 228-232 of the method 200.

A process 228 of the method 200 may include removing the placeholder material revealed at the back side of the support structure as a result of performing the process 226. An IC structure 328 of FIG. 3N illustrates an example result of performing the process 228.

As shown in FIG. 3N, the IC structure 338 may include an opening 379, formed by removal of the placeholder material 352. Any suitable etch process may be used to remove the placeholder material 352 in the process 228. In some embodiments, a selective etch may be used to remove the placeholder material 352 without substantially removing other portions of the IC structure 328.

Because the placeholder material 352 is sufficiently etch-selective with respect to the liner dielectric material 364, in the IC structure 338, the liner dielectric material 364 remains at the bottom of the opening 379, covering the S/D material 366. Therefore, the method 200 may further include a process 230 in which the liner dielectric material 364 is removed from the bottom of the opening 379, forming a further opening 381 that exposes the S/D material 366. The process 230 may also include depositing another liner dielectric material on sidewalls and bottom of the opening 379 with a portion of the liner dielectric material 364 removed to expose the S/D material 366. An IC structure 330 of FIG. 3O illustrates an example result of performing the process 230. FIG. 3O illustrates that the liner dielectric material deposited on the sidewalls and the bottom of the opening 379 is the liner dielectric material 364. However, in other embodiments, the exact material composition of the liner dielectric material 364 and the liner dielectric material deposited in the process 230 may be slightly different, as long as the liner dielectric material deposited in the process 230 maintains the properties with respect to other materials as described above with reference to the liner dielectric material 364, in particular with respect to the replacement dielectric material 380 to be provided in a later process. In some embodiments, the process 230 may include, first, providing the liner dielectric material deposited on the sidewalls and the bottom of the opening 379 and then forming the opening 381 in a process that may be referred to as a S/D punch.

By comparing the top-down view of the IC structure 330 with that of the IC structure 302, the opening 381, shown in FIG. 3O, is aligned along the x-axis with the opening 353 for the placeholder material 352, shown in FIG. 3A. On the other hand, in the direction of the y-axis, the opening 381, shown in FIG. 3O, is aligned based on the thickness of the liner dielectric material 364 on the sidewalls of the opening 367-1, deposited in the process 314, as shown in FIG. 3G.

Replacing the exposed placeholder material with a portion of a backside S/D contact may conclude with a process 232, that may include filling the openings 379 and 381 with an electrically conductive material 378, thus forming a backside S/D contact 383. An IC structure 332 of FIG. 3P illustrates an example result of performing the process 232.

In general, various electrically conductive materials described herein, e.g., the electrically conductive material 378, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, molybdenum, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals. The electrically conductive material 378 may be deposited in the process 232 using a deposition technique such as, but not limited to, ALD, CVD, PVD, plasma enhanced CVD (PECVD), or electroplating.

The method 200 may further include a process 234, which includes removing the support structure 350 while leaving the backside S/D contact 383 formed in the process 232. An IC structure 334 of FIG. 3Q illustrates an example result of performing the process 234. In some embodiments, a selective isotropic etch may be used to remove the support structure 350 in the process 234 without substantially etching other portions of the IC structure 334. The support structure 350 that was removed in the process 234 may then be replaced with the replacement dielectric material 380 in a process 236 of the method 200. An IC structure 336 of FIG. 3R illustrates an example result of performing the process 236. The replacement dielectric material 380 may be deposited around the backside S/D contact 383 using any suitable technique such as ALD, CVD, spin-coating, or dip-coating, possibly in combination with a suitable polishing technique to remove excess of the replacement dielectric material 380 so that the electrically conductive material 378 of the backside S/D contact 383 may be revealed. Replacing the support structure 350 with the replacement dielectric material 380, which may be, e.g., any of the low-k dielectric materials described herein, may be advantageous in terms of reducing capacitance associated with the backside S/D contact 383.

The method 200 may further include a process 238, which includes providing a backside power rail 382 electrically coupled to the backside S/D contact 383. An IC structure 338 of FIG. 3S illustrates an example result of performing the process 238. The backside power rail 382 may be provided in the process 238 using any known process for providing power rails, e.g., using any suitable technique for depositing one or more electrically conductive materials of the backside power rail 382 (e.g., using any deposition technique as described above), possibly in combination with patterning (e.g., using any patterning technique as described above), and may include any of the electrically conductive materials described above. In various embodiments, the electrically conductive material(s) of the backside power rail 382 may, but do not have to, be the same as the electrically conductive material 378 of the backside S/D contact 383.

The backside power rail 382 may, e.g., be a power rail for providing power to the transistor 377 and other transistors of the IC structure 338.

In general, the backside power rail 382 does not have to be self-aligned to the edges of the backside S/D contact 383, e.g., with respect to the edges in the direction of the x-axis. In general, making the backside power rail 382 sufficiently wide (in the direction of the x-axis) would ensure that an optimal contact is made between the backside power rail 382 and the backside S/D contact 383.

Manufacturing transistor arrangements using a placeholder for backside contact formation as was described with reference to the method 200 leaves several characteristic features in the final IC structure. These characteristic features will now be described with reference to the IC structure 338, shown in FIG. 3S. To assist the explanations, FIG. 3S illustrates the dash-dotted outline of the transistor 377 that was described with reference to FIG. 3K.

One characteristic feature is that the backside S/D contact 383 is realized as a via that extends through a backside layer of a dielectric material, e.g., the replacement dielectric material 380, where the via having a first portion 387-1 and a second portion 387-2, as shown in FIG. 3S. The first portion 387-1 has an end (e.g., the upper end of the first portion 387-1 in the cross-sectional side view of FIG. 3S) that is in contact with the electrically conductive line that forms the backside power rail 382. The second portion 387-2 has an end (e.g., the lower end of the second portion 387-2 in the cross-sectional side view of FIG. 3S) that is in contact with the first S/D region of the transistor 377.

Another characteristic feature of the use of the fabrication method that relies on using a placeholder for backside contact formation as described herein is that a dimension of the first S/D region (e.g., the S/D region of the transistor 377 indicated in FIG. 3S with a dotted contour) in a direction of the long axis of the nanoribbon 375-1 (e.g., a dimension 391, shown in FIG. 3S) is smaller than a dimension of the first portion 387-1 of the via of the backside S/D contact 383 in the direction of the long axis of the nanoribbon (e.g., a dimension 385, shown in FIG. 3S). Similarly, a dimension of the second portion 387-2 of the via of the backside S/D contact 383 in the direction of the long axis of the nanoribbon 375-1 (e.g., the dimension 391, shown in FIG. 3S) is smaller than the dimension of the first portion 387-1 of the via of the backside S/D contact 383 in the direction of the long axis of the nanoribbon 375-1 (e.g., the dimension 385, shown in FIG. 3S).

Yet another characteristic feature is that one or more sidewalls of the via of the backside S/D contact 383 are lined with the liner dielectric material 364 which is different from the replacement dielectric material 380 surrounding the via and which is also different from conventional diffusional barrier materials typically used to line via sidewalls. For example, the dielectric constant of the liner dielectric material 364 is higher than the dielectric constant of the replacement dielectric material 380 and is lower than about 6.

The second portion 387-2 of the via of the backside S/D contact 383 may be seen as having a first sub-portion and a second sub-portion, the first sub-portion being between the first S/D region of the transistor 377 and the second sub-portion. Another characteristic feature of the use of the fabrication method that relies on using a placeholder for backside contact formation as described herein is that the first sub-portion includes the S/D material 366, while each of the first portion 387-1 of the via of the backside S/D contact 383 and the second sub-portion of the second portion 387-2 of the via includes one or more electrically conductive materials of the backside S/D contact (e.g., an electrically conductive material 378, shown in FIG. 3S).

Sidewalls of the via of the backside S/D contact 383 may further have a horizontal sidewall portion 387-3, shown in FIG. 3S, between the first portion 387-1 and the second portion 387-2, the horizontal sidewall portion 387-3 being substantially parallel to a plane of the long axis of the nanoribbons 375 (i.e., substantially in an x-y plane), and a vertical sidewall portion (e.g., a portion of the first portion 387-1 of the via) between the horizontal sidewall portion 387-3 and an upper surface of the backside layer. Still another characteristic feature is that a thickness of the liner dielectric material 364 over the horizontal sidewall portion 387-3 may be smaller than a thickness of the liner dielectric material 364 over the vertical sidewall portion 387-1.

Turning to the other S/D region of the transistor 377, yet another characteristic feature of the use of the fabrication method that relies on using a placeholder for backside contact formation as described herein is that there is a cap portion 389 of the liner dielectric material 364 provided over the second S/D region of the transistor 377.

Nanoribbon-Based Transistor Arrangements with Backside Gate Contacts

Besides forming backside S/D contacts as was described with reference to FIGS. 3A-3S, some processes of the method 200 may be performed (e.g., on other parts of the IC structures illustrated in FIGS. 3A-3S) to form backside gate contacts. In other words, some of the processes of the method 200 may be used to form one or more backside gate contacts on one or more fins 359. In some embodiments, various processes of the method 200 may be performed substantially simultaneously to form both backside S/D contacts and backside gate contacts. A person of ordinary skill in the art will readily realize which processes of the method 200 are unique to forming S/D contacts only (e.g., processes 208-222) and which processes may be applicable to both S/D and gate contacts (e.g., processes 202 and 228-238). Results of performing some of the processes of the method 200 but for forming backside gate contacts are illustrated in FIGS. 4A-4E.

FIGS. 4A-4E provide top-down and cross-sectional side views at various stages in the manufacture of an example nanoribbon-based transistor arrangement according to the method 200 of FIG. 2 similar to the illustrations of FIG. 3, but now for a backside gate contact, in accordance with some embodiments.

Figure 4A:
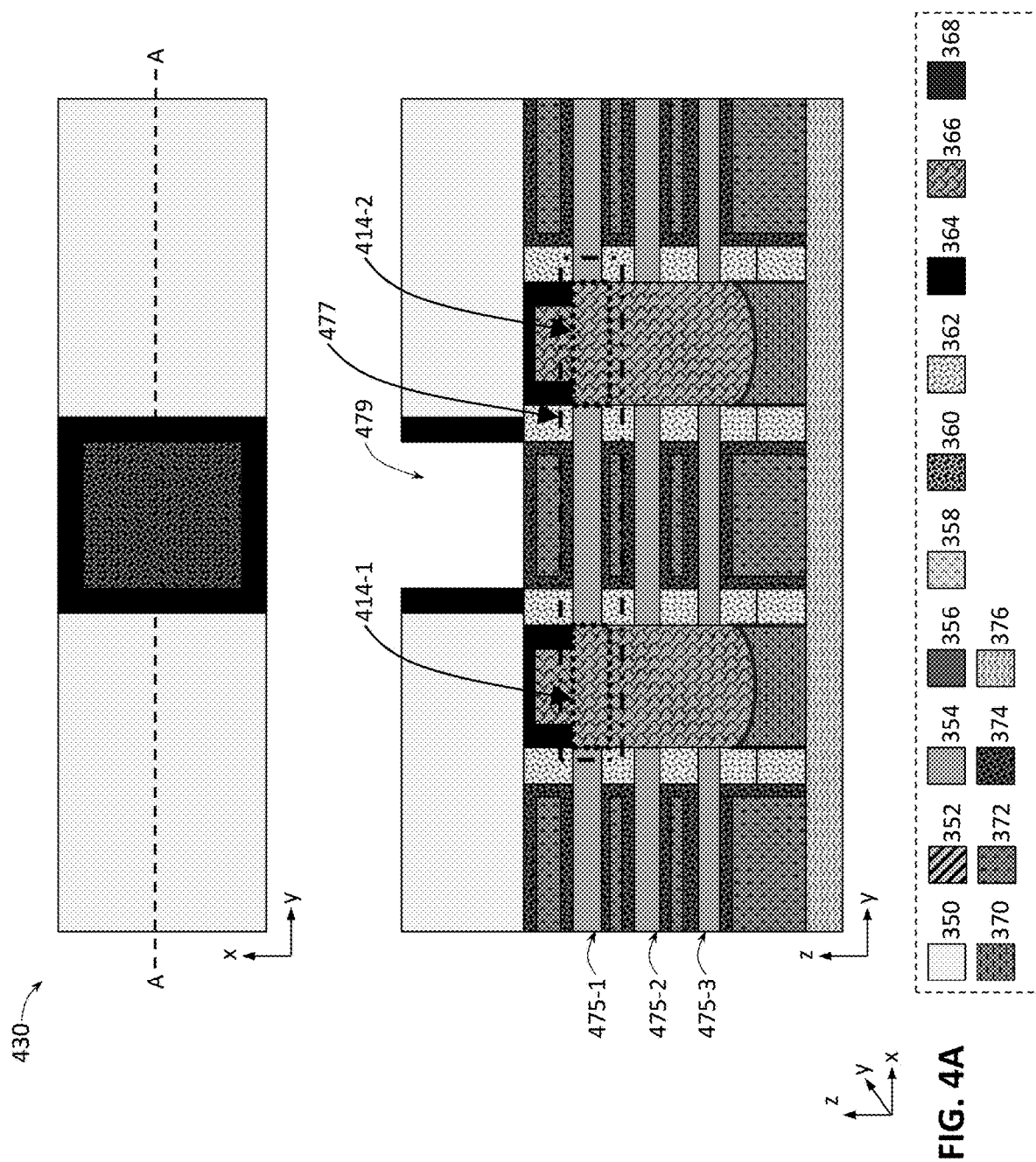

FIG. 4A illustrates an IC structure 430, which is a result of performing the process 230 but for forming a backside gate contact. In particular, the IC structure 430 illustrates an opening 479, similar to the opening 379 in the IC structure 330, that includes the liner dielectric material 364 provided over the sidewalls of the opening 479. What is not shown in FIGS. 4A-4E is that, in earlier fabrication processes, first, a placeholder for the future backside gate contact is provided (e.g., using the process 202) and then, once the carrier wafer has been attached and turned over in the process 226, the placeholder for the backside gate contact is removed (e.g., using the process 228). The illustration of FIG. 4A is a continuation of the method 200 once the placeholder for the backside gate contact has been removed.

One example nanoribbon-based transistor is labeled in FIG. 4A as a transistor 477, an approximate boundary of which is indicated with a dash-dotted contour. The transistor 477 is provided along a nanoribbon 475-1. In some embodiments, the stack of nanoribbons 475-1 through 475-3 may be similar to the stack of the nanoribbons 375-1 through 375-3, but provided along a different instance of a fin similar to the fin 359. Similar to the nanoribbon 375-1, the nanoribbon 475-1 has a long axis that is substantially parallel to the support structure 350 (e.g., having a long axis along the y-axis of the example coordinate system shown in the present drawings). A channel portion of the transistor 477 is a portion of the first semiconductor material 354 of the nanoribbon 475-1 that is wrapped (at least partially) by the gate stack 371-2. A first S/D region and a second S/D region of the transistor 477 are portions of the S/D material 366 provided on either side of the channel portion of the transistor 477, indicated in FIG. 4A as portions of the S/D material 366 within dotted contours shown on the opposite sides of the channel portion of the transistor 477. In particular, FIG. 4A shows a first S/D region 414-1 and a second S/D region 414-2, similar to the arrangement of the first and second S/D regions 114-1 and 114-2 with respect to the gate stack as shown in FIG. 1.

Figure 4B:
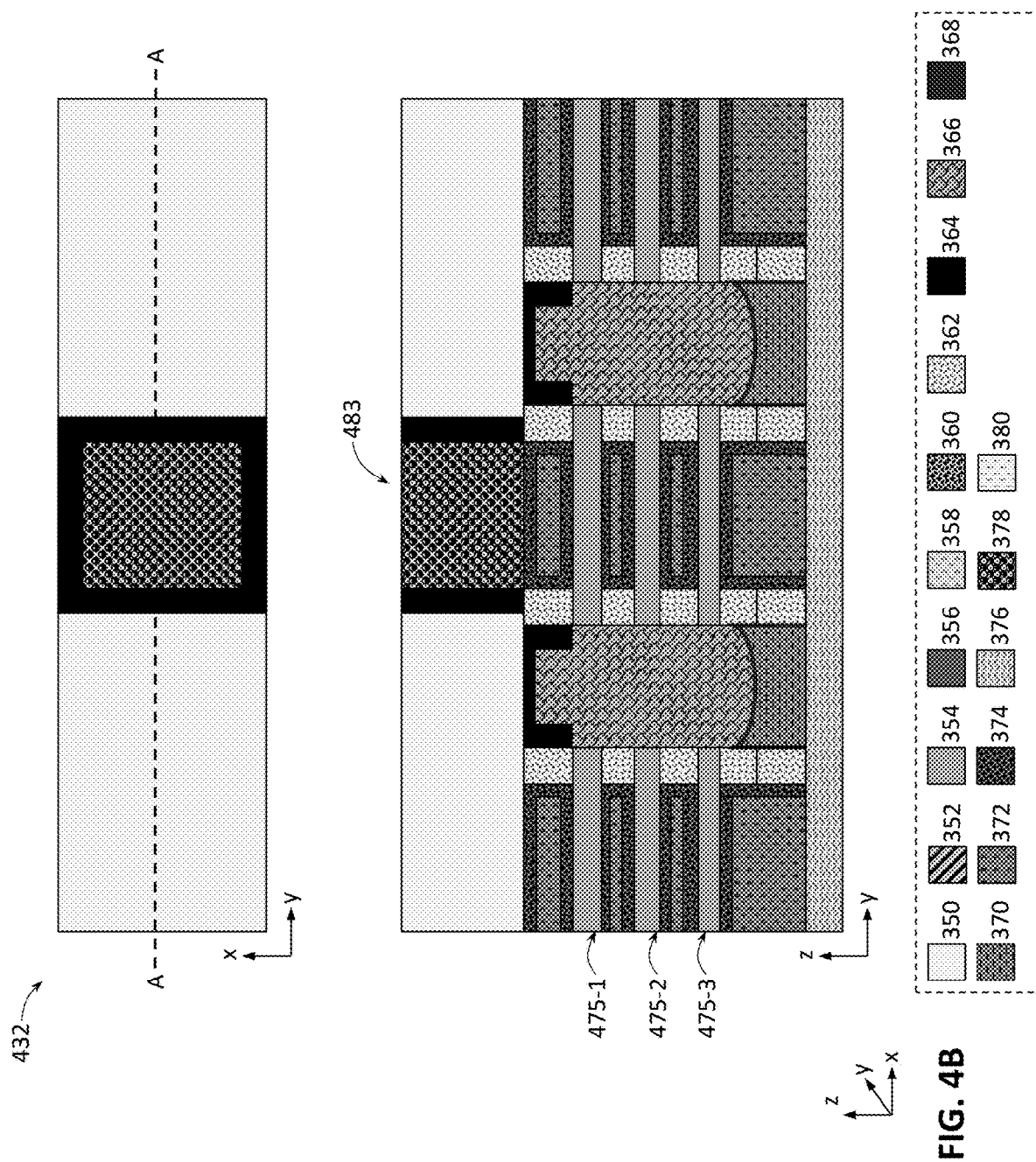

FIG. 4B illustrates an IC structure 432, which is a result of performing the process 232 but for forming a backside gate contact. In particular, the IC structure 432 illustrates that the opening 479, formed in the process 230, is filled with the electrically conductive material 378, thus forming a backside gate contact 483. The IC structure 432 is similar to the IC structure 332, but for the case of forming a backside gate contact.

Figure 4C:
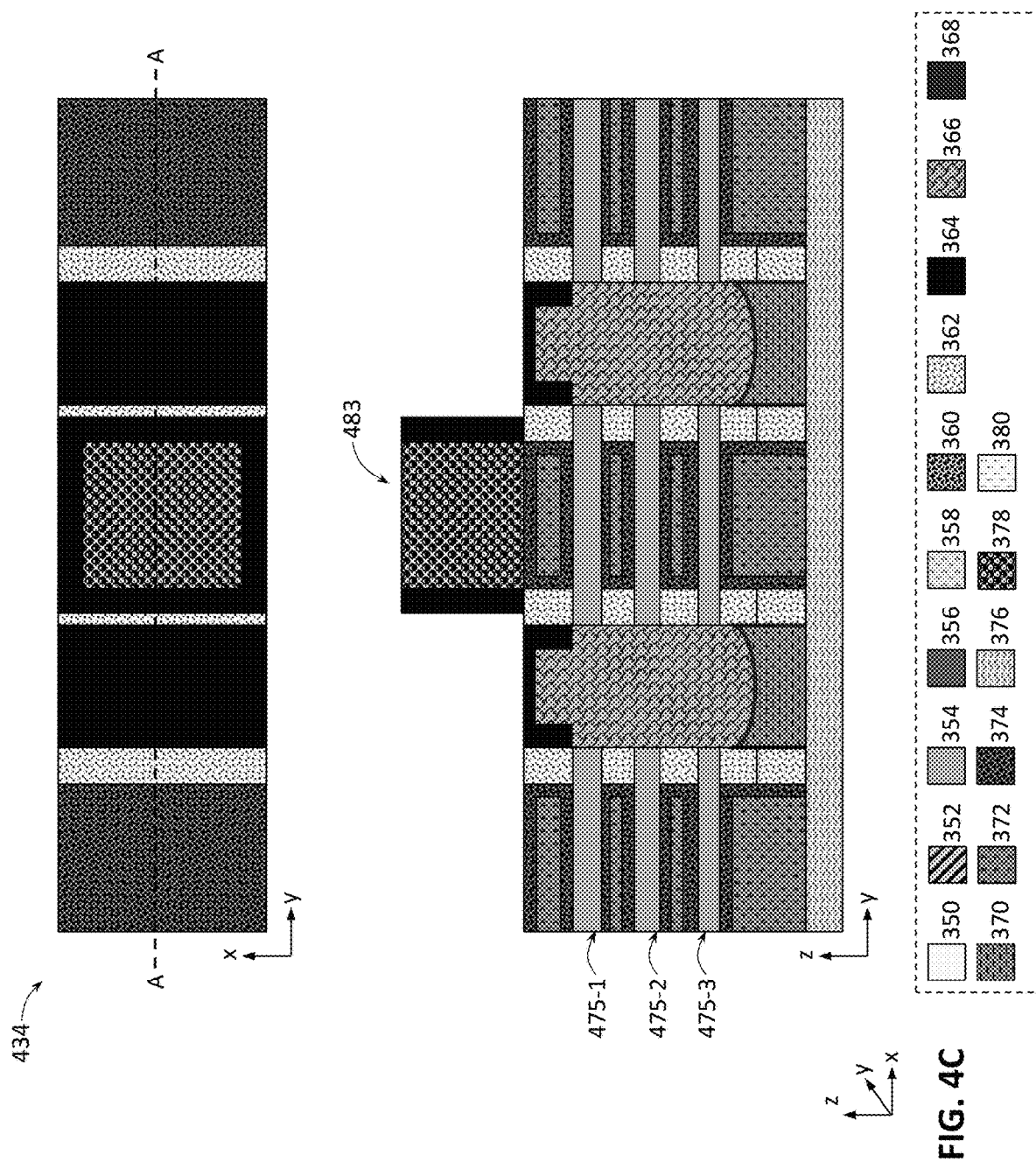

FIG. 4C illustrates an IC structure 434, which is a result of performing the process 234 but for forming a backside gate contact. In particular, the IC structure 434 illustrates that the support structure 350 is removed while leaving the backside gate contact 483 formed in the process 232. The IC structure 434 is similar to the IC structure 334, but for the case of forming a backside gate contact.

As described above, the support structure 350 that was removed in the process 234 may then be replaced with the replacement dielectric material 380 in a process 236 of the method 200. FIG. 4D illustrates an IC structure 436, which is a result of performing the process 236 but for forming a backside gate contact. In particular, the IC structure 436 illustrates that the replacement dielectric material 380 may be deposited around the backside gate contact 483. The IC structure 436 is similar to the IC structure 336, but for the case of forming a backside gate contact.

Figure 4E:
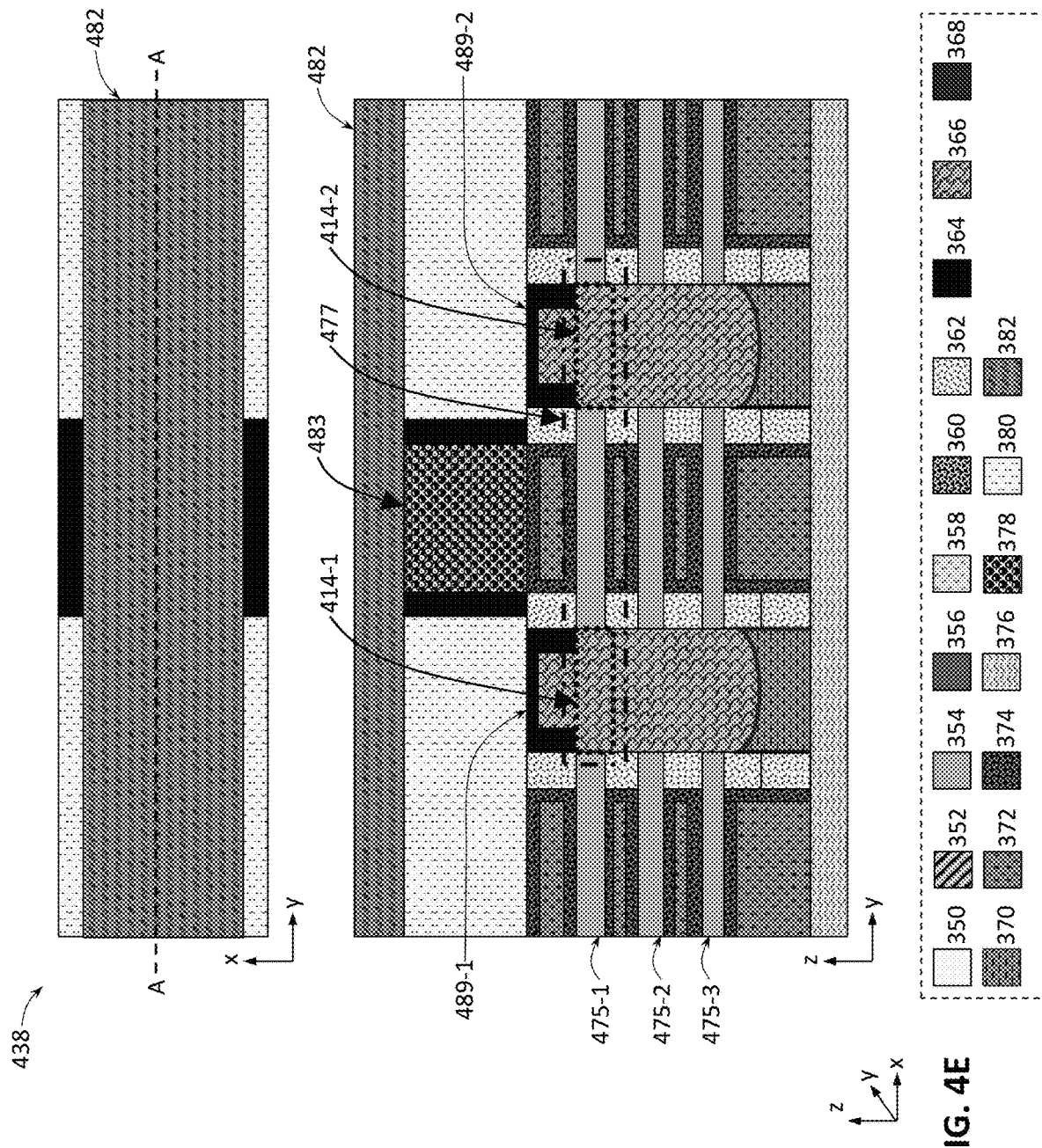

FIG. 4E illustrates an IC structure 438, which is a result of performing the process 238 but for forming a backside gate contact. In particular, the IC structure 438 illustrates a backside power rail 482, electrically coupled to the backside gate contact 483. The backside power rail 482 may, e.g., be a power rail for providing power to a transistor 477 and other transistors of the IC structure 438. The IC structure 438 is similar to the IC structure 338, but for the case of forming a backside gate contact.

Manufacturing transistor arrangements with a placeholder for backside gate contact formation using the method 200 leaves several characteristic features in the IC structure 438.

One characteristic feature is that the via for the backside gate contact 483 is lined with the liner dielectric material 364 which is different from the replacement dielectric material 380 surrounding the via and which is also different from conventional diffusional barrier materials typically used to line via sidewalls.

Another characteristic feature is the presence of a first cap portion 489-1 of the liner dielectric material 364 provided over the first S/D region 414-1 and the presence of a second cap portion 489-2 of the liner dielectric material 364 provided over the second S/D region 414-2 of the transistor 477.

Although FIGS. 4A-4E illustrate the backside gate contact 483 that appears to be self-aligned to the gate stack below it (e.g., the gate stack of the transistor 477), in other embodiments of these IC structures there may be a misalignment in that the backside gate contact 483 may be shifted slightly to the left or to the right with respect to the gate stack of the transistor 477 because the method 200 does not provide self-alignment of these portions. However, the method 200 does provide spacer dielectric material 362 around the gate stack of the transistor 477 and the liner dielectric material 364 on the sidewalls of the via for the backside gate contact 483 and in the cap portions 489-1 and 489-2, which ensures that, even if the backside gate contact 483 is misaligned with respect to the gate stack below it, there is no electrical coupling (short circuit) between the electrically conductive material of the backside gate contact 483 and the S/D regions of the transistor 477.

Example Devices

The IC structures with transistor arrangements fabricated using placeholders for backside contact formation, disclosed herein, may be included in any suitable electronic device. FIGS. 5-8 illustrate various examples of apparatuses that may include one or more of the IC structures disclosed herein.

Figures 5A, 5B:
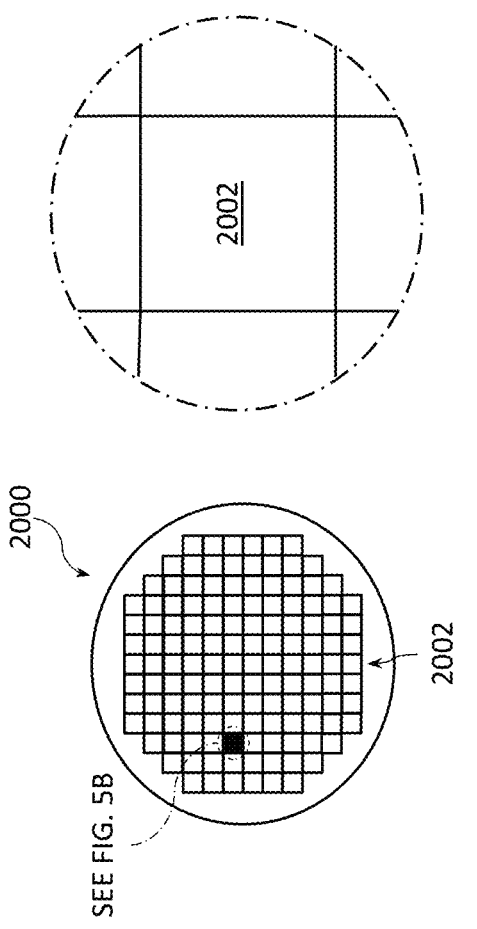
FIGS. 5A and 5B are top views of, respectively, a wafer and dies that may include one or more transistor arrangements fabricated using a placeholder for backside contact formation, in accordance with various embodiments.

FIGS. 5A-5B are top views of a wafer 2000 and dies 2002 that may include one or more transistor arrangements fabricated using placeholders for backside contact formation in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more transistor arrangements fabricated using placeholders for backside contact formation as described herein). After the fabrication of the semiconductor product is complete (e.g., after manufacture of one or more layers of the transistor arrangements fabricated using placeholders for backside contact formation as described herein), the wafer 2000 may undergo a singulation process in which each of the dies 2002 is separated from one another to provide discrete "chips" of the semiconductor product. In particular, devices that include one or more transistor arrangements fabricated using placeholders for backside contact formation as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 8) or other logic that is configured to store information in the memory devices or execute instructions stored in the memory array.

Figure 6:
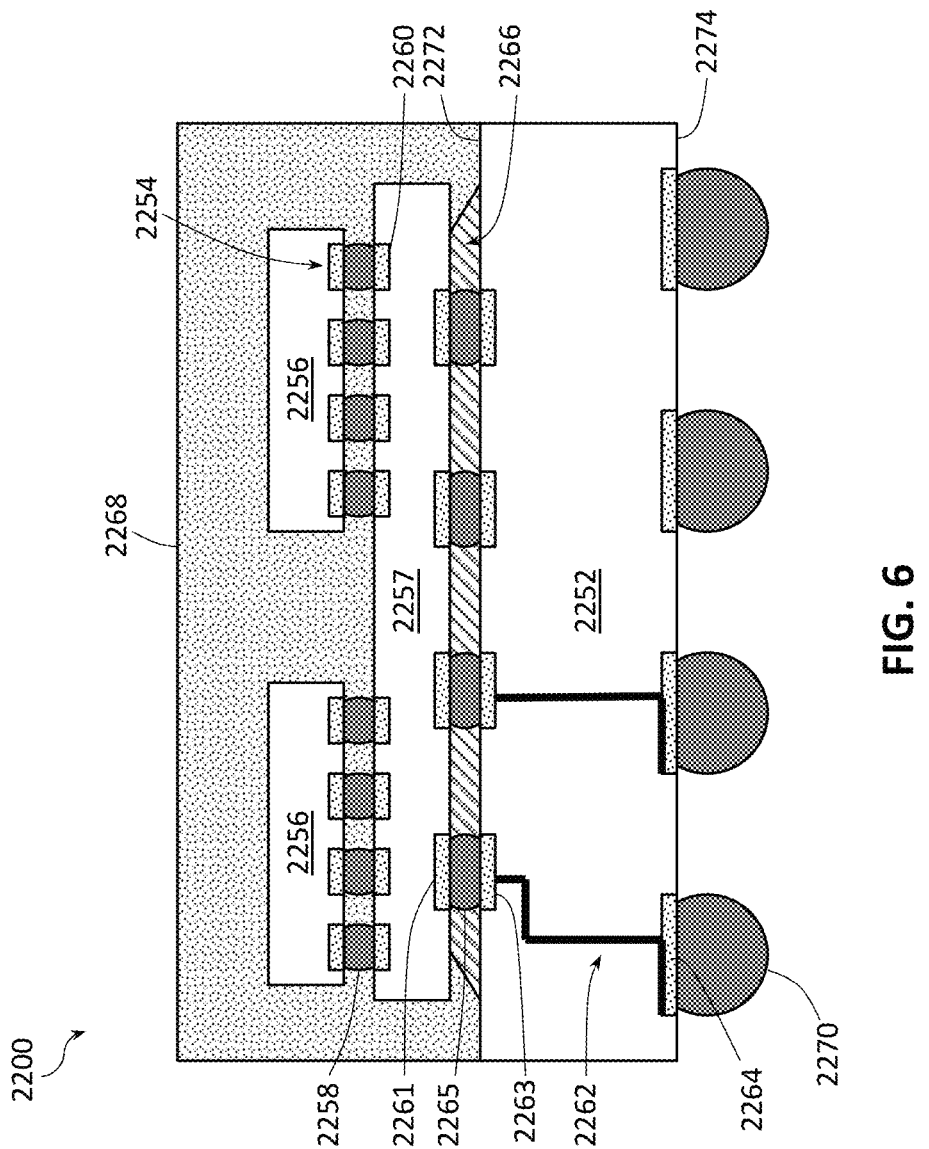
FIG. 6 is a cross-sectional side view of an integrated circuit (IC) package that may include one or more transistor arrangements fabricated using a placeholder for backside contact formation, in accordance with various embodiments.

FIG. 6 is a side, cross-sectional view of an example IC package 2200 that may include one or more transistor arrangements fabricated using placeholders for backside contact formation in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein (e.g., may include any of the embodiments of the transistor arrangements fabricated using placeholders for backside contact formation as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more transistor arrangements fabricated using placeholders for backside contact formation as discussed above; in some embodiments, at least some of the dies 2256 may not include any transistor arrangements fabricated using placeholders for backside contact formation.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
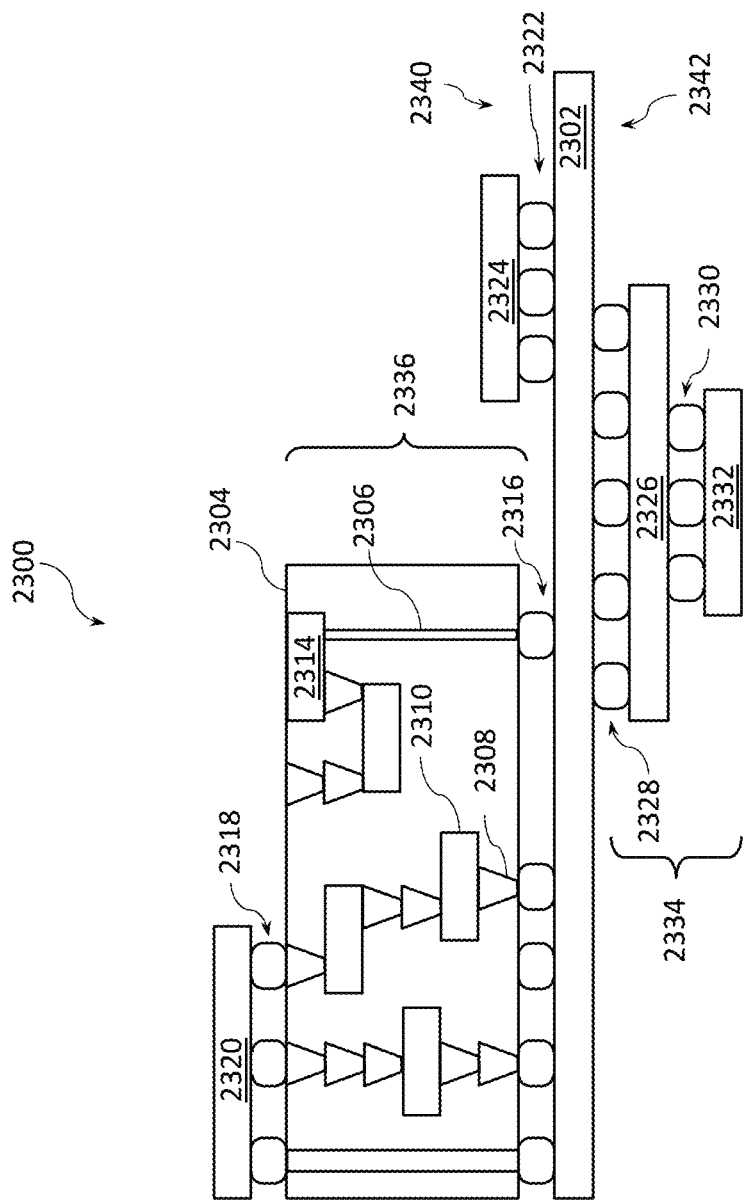
FIG. 7 is a cross-sectional side view of an IC device assembly that may include one or more transistor arrangements fabricated using a placeholder for backside contact formation, in accordance with various embodiments.

FIG. 7 is a cross-sectional side view of an IC device assembly 2300 that may include components having one or more transistor arrangements fabricated using placeholders for backside contact formation in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more transistor arrangements fabricated using placeholders for backside contact formation in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more transistor arrangements fabricated using placeholders for backside contact formation provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device, or any other suitable component. In particular, the IC package 2320 may include one or more transistor arrangements fabricated using placeholders for backside contact formation as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
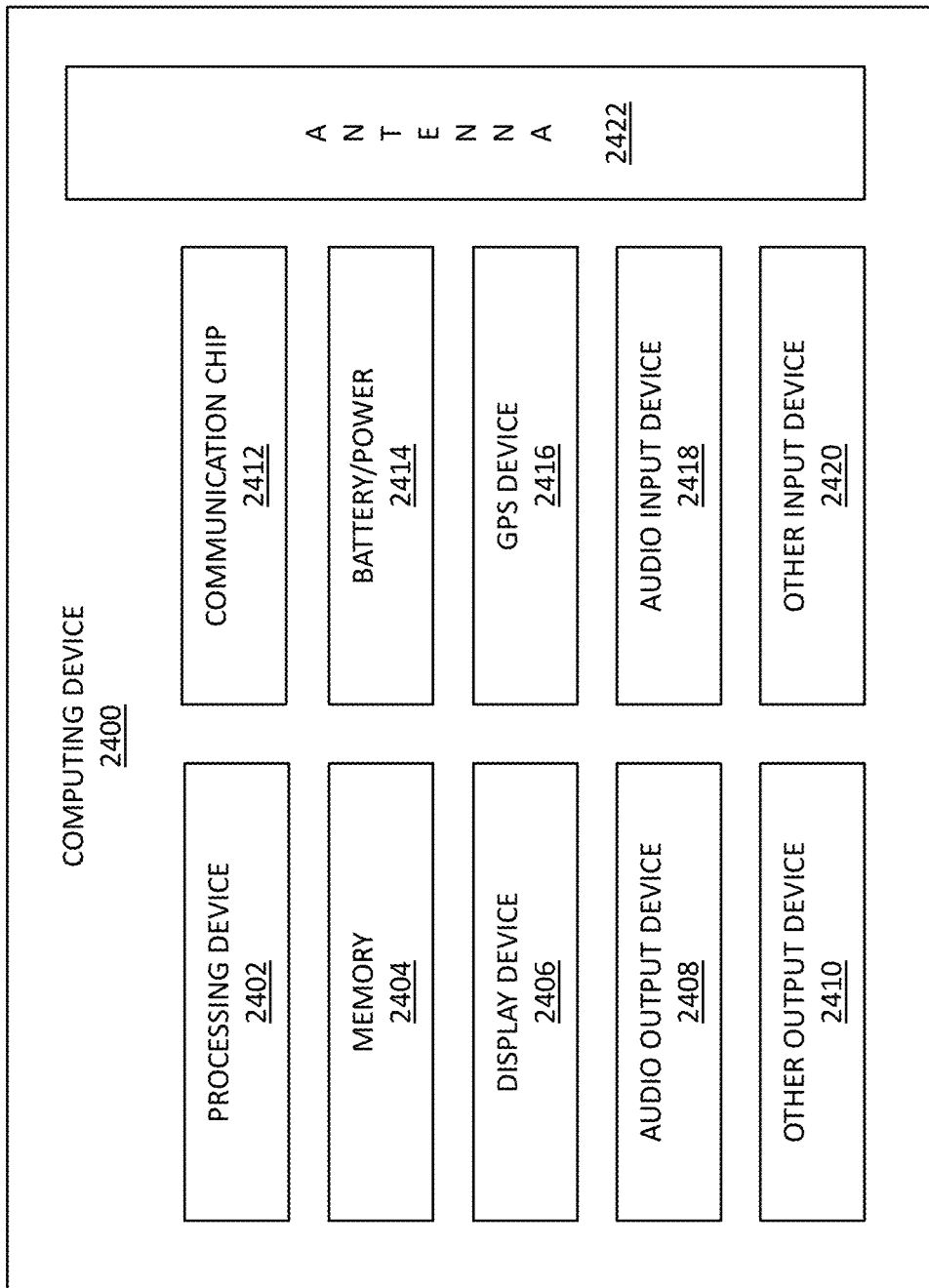
FIG. 8 is a block diagram of an example computing device that may include one or more transistor arrangements fabricated using a placeholder for backside contact formation, in accordance with various embodiments.

FIG. 8 is a block diagram of an example computing device 2400 that may include one or more components with one or more transistor arrangements fabricated using placeholders for backside contact formation in accordance with any of the embodiments disclosed herein. For example, any suitable ones of the components of the computing device 2400 may include a die (e.g., the die 2002, shown in FIG. 5B) including one or more transistor arrangements fabricated using placeholders for backside contact formation in accordance with any of the embodiments disclosed herein. Any of the components of the computing device 2400 may include an IC package 2200 (e.g., as shown in FIG. 6). Any of the components of the computing device 2400 may include an IC device assembly 2300 (e.g., as shown in FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides a transistor arrangement that includes a backside layer of a first dielectric material (e.g., a layer of the replacement dielectric material 380, shown in the present drawings), an electrically conductive line provided over the backside layer, and a nanoribbon of a channel material (e.g., the first semiconductor material 354, shown in the present drawings), the nanoribbon having a long axis that is substantially parallel to the backside layer (e.g., having a long axis along the y-axis of the example coordinate system shown in the present drawings), where the backside layer is between the nanoribbon and the electrically conductive line. The transistor arrangement further includes a transistor that has a channel portion that includes a portion of the channel material of the nanoribbon, a gate stack, at least partially wrapping around the channel portion, and a first source or drain (S/D) region and a second S/D region, provided in the nanoribbon on either side of the channel portion. The transistor arrangement also includes a backside S/D contact that includes a via that extends through the backside layer, the via having a first portion (e.g., a portion 387-1, shown in FIG. 3S) that has a first end in contact with the electrically conductive line, and further having a second portion (e.g., a portion 387-2, shown in FIG. 3S) that has a second end in contact with the first S/D region, where a dimension of the first S/D region in a direction of the long axis of the nanoribbon (e.g., the dimension 391, shown in FIG. 3S) is smaller than a dimension of the first portion of the via in the direction of the long axis of the nanoribbon (e.g., the dimension 385, shown in FIG. 3S).

Example 2 provides the transistor arrangement according to example 1, where one or more sidewalls of the via are lined with a second dielectric material (e.g., the liner dielectric material 364, shown in the present drawings), and a dielectric constant of the second dielectric material is higher than a dielectric constant of the first dielectric material and is lower than about 6.

Example 3 provides the transistor arrangement according to example 2, where the dielectric constant of the first dielectric material is lower than a 3.5. For example, a classic low-k material such as organosilicate glass has a dielectric constant of about 3.0.

Example 4 provides the transistor arrangement according to examples 2 or 3, where the dielectric constant of the second dielectric material is between about 3.5 and about 5.5.

Example 5 provides the transistor arrangement according to any one of examples 2-4, where a density of the second dielectric material is higher than a density of the first dielectric material.

Example 6 provides the transistor arrangement according to example 5, where the density of the first dielectric material is lower than 1.8 gram per cubic centimeter. For example, a classic low-k material such as organosilicate glass has a density of about 1.4 g/cm$^3$.

Example 7 provides the transistor arrangement according to examples 5 or 6, where the density of the second dielectric material is above 1.8 gram per cubic centimeter.

Example 8 provides the transistor arrangement according to any one of examples 5-7, where the density of the second dielectric material is between about 1.8 and 3 gram per cubic centimeter, e.g., between about 1.9 and about 2.5 gram per cubic centimeter.

Example 9 provides the transistor arrangement according to any one of examples 2-8, where the one or more sidewalls of the via have a horizontal sidewall portion (e.g., a portion 387-3, shown in FIG. 3S) between the first portion and the second portion of the via, the horizontal sidewall portion being substantially parallel to a plane of the long axis of the nanoribbon, and a vertical sidewall portion (e.g., a portion of the first portion 387-1 of the via) between the horizontal sidewall portion and an upper surface of the backside layer, where a thickness of the second dielectric material over the horizontal sidewall portion is smaller than a thickness of the second dielectric material over the vertical sidewall portion.

Example 10 provides the transistor arrangement according to any one of examples 2-9, further including the second dielectric material in a cap portion 389 (shown in FIG. 3S) between the second S/D region and the first dielectric material.

Example 11 provides the transistor arrangement according to any one of the preceding examples, where a dimension of the second portion of the via in the direction of the long axis of the nanoribbon (e.g., the dimension 391, shown in FIG. 3S) is smaller than the dimension of the first portion of the via in the direction of the long axis of the nanoribbon (e.g., the dimension 385, shown in FIG. 3S).

Example 12 provides the transistor arrangement according to any one of the preceding examples, where the first S/D region of the transistor includes a S/D material (e.g., the S/D material 366, shown in FIG. 3S), the second portion of the via has a first sub-portion and a second sub-portion, the first sub-portion being between the first S/D region and the second sub-portion, the first sub-portion of the second portion of the via includes the S/D material, and each of the first portion of the via and the second sub-portion of the second portion of the via includes one or more electrically conductive materials of the backside S/D contact (e.g., an electrically conductive material 378, shown in FIG. 3S).

Example 13 provides the transistor arrangement according to any one of the preceding examples, where the electrically conductive line is a power rail for providing power to the transistor.

Example 14 provides the transistor arrangement according to any one of the preceding examples, further including a first-level interconnect layer, provided over the nanoribbon so that a layer with the transistor is between the backside layer and the first-level interconnect layer.

Example 15 provides a transistor arrangement that includes a backside layer of a first dielectric material (e.g., a layer of the dielectric material 380, shown in the present drawings), an electrically conductive line provided over the backside layer, and a nanoribbon of a channel material (e.g., the first semiconductor material 354, shown in the present drawings), the nanoribbon having a long axis that is substantially parallel to the backside layer (e.g., having a long axis along the y-axis of the example coordinate system shown in the present drawings), where the backside layer is between the nanoribbon and the electrically conductive line. The transistor arrangement also includes a transistor that includes a channel portion that includes a portion of the channel material of the nanoribbon, a gate stack, at least partially wrapping around the channel portion, and a first source or drain (S/D) region and a second S/D region, provided in the nanoribbon on either side of the channel portion. The transistor arrangement further includes a backside gate contact that includes a via that extends through the backside layer, the via having a first end in contact with the electrically conductive line and a second end in contact with the gate stack, where one or more sidewalls of the via are lined with a second dielectric material (e.g., the dielectric material 364, shown in the present drawings), a dielectric constant of the second dielectric material is higher than a dielectric constant of the first dielectric material and is lower than about 6, and the transistor arrangement further includes the second dielectric material in a cap portion 489-1 (shown in FIG. 4E) between the first S/D region and the first dielectric material.

Example 16 provides the transistor arrangement according to example 15, further including the second dielectric material in a cap portion 489-2 (shown in FIG. 4E) between the second S/D region and the first dielectric material.

Example 17 provides the transistor arrangement according to examples 15 or 16, where a density of the second dielectric material is higher than a density of the first dielectric material.

In various further examples of the transistor arrangement according to any one of examples 15-17, the first and/or second dielectric materials may be the first and/or second dielectric materials according to any one of the preceding examples.

Example 18 provides a method of fabricating a transistor arrangement. The method includes providing, in a support structure (e.g., a support structure 350, shown in FIG. 3A), an opening for a placeholder for a backside contact, the opening extending from a first face (e.g., a face 351-1, shown in FIG. 3A) of the support structure towards but not reaching a second face (e.g., a face 351-2, shown in FIG. 3A) of the support structure; providing a placeholder material (e.g., a placeholder material 352) within the placeholder opening, an upper surface of the placeholder material recessed by a distance 355, shown in FIG. 3A, with respect to the first face of the support structure; providing a stack of alternating layers of first and second semiconductor materials (e.g., the semiconductor materials 354 and 356, shown in FIG. 3B) over the support structure with the placeholder material; forming a nanoribbon of a layer of the first semiconductor material closest to the support structure (e.g., the nanoribbon 375-1, shown in FIG. 3K), the nanoribbon having a long axis that is substantially parallel to the support structure (e.g., having a long axis along the y-axis of the example coordinate system shown in the present drawings); and providing a transistor that includes a channel portion that includes a portion of the channel material of the nanoribbon, a gate stack, at least partially wrapping around the channel portion, and a first source or drain (S/D) region and a second S/D region, provided in the nanoribbon on either side of the channel portion. The method also includes, after providing the transistor, recessing the second face of the support structure to reveal the placeholder material; replacing the placeholder material with a portion of a backside S/D contact; replacing at least a portion of the support structure with a backside layer of a first dielectric material (e.g., the replacement dielectric material 380, shown in FIG. 3S); and providing an electrically conductive line (e.g., the backside power rail 382, shown in FIG. 3S) over the backside layer, where the backside S/D contact includes a via that extends through the backside layer, the via having a first portion (e.g., a portion 387-1, shown in FIG. 3S) that has a first end in contact with the electrically conductive line, and further having a second portion (e.g., a portion 387-2, shown in FIG. 3S) that has a second end in contact with the first S/D region.

Example 19 provides the method according to example 18, where providing the stack includes performing an ELO to provide the second semiconductor material in a recess of the placeholder material.

Example 20 provides the method according to examples 18 or 19, where one or more sidewalls of the via are lined with a second dielectric material (e.g., the dielectric material 364, shown in the present drawings), a dielectric constant of the second dielectric material is higher than a dielectric constant of the first dielectric material and is lower than about 6.

Example 21 provides the method according to any one of examples 17-20, where replacing the at least a portion of the support structure with the backside layer of the first dielectric material includes performing an etch to remove at least a portion of the support structure after the backside S/D contact has been formed, and depositing the first dielectric material to replace the removed portion of the support structure.

Example 22 provides the method according to any one of examples 18-21, where the transistor arrangement is the transistor arrangement according to any one of examples 1-17, and the method further includes processes for fabricating the transistor arrangement according to any one of examples 1-17.

Example 23 provides an IC package that includes an IC die and a further IC component, coupled to the IC die. The IC die includes one or more transistor arrangements according to any one of the preceding examples (e.g., each transistor arrangement may be a transistor arrangement according to any one of examples 1-17 and/or may be formed according to a method of any one of examples 18-22).

Example 24 provides the IC package according to example 23, where the further component is one of a package substrate, a flexible substrate, or an interposer.

Example 25 provides the IC package according to examples 23 or 24, where the further component is coupled to the IC die via one or more first-level interconnects.

Example 26 provides the IC package according to example 25, where the one or more first-level interconnects include one or more solder bumps, solder posts, or bond wires.

Example 27 provides a computing device that includes a circuit board; and an IC die coupled to the circuit board, where the IC die includes one or more of: one or more transistor arrangements according to any one of the preceding examples (e.g., each transistor arrangement may be a transistor arrangement according to any one of examples 1-17 and/or may be formed according to a method of any one of examples 18-22), and the IC package according to any one of the preceding examples (e.g., the IC package according to any one of examples 23-26).

Example 28 provides the computing device according to example 27, where the computing device is a wearable computing device (e.g., a smart watch) or handheld computing device (e.g., a mobile phone).

Example 29 provides the computing device according to examples 27 or 28, where the computing device is a server processor.

Example 30 provides the computing device according to examples 27 or 28, where the computing device is a motherboard.

Example 31 provides the computing device according to any one of examples 27-30, where the computing device further includes one or more communication chips and an antenna.

Example 32 provides a method of fabricating a transistor arrangement, the method comprising processes for forming the transistor arrangement according to any one of the preceding examples (e.g., the transistor arrangement may be a transistor arrangement according to any one of examples 1-18).

Example 33 provides a method of fabricating an IC package, the method comprising processes for forming the IC package according to any one of the preceding examples (e.g., the IC package may be an IC package according to any one of examples 23-26).

Example 34 provides a method of fabricating an computing device, the method comprising processes for forming the computing device according to any one of the preceding examples (e.g., the computing device may be a computing device according to any one of examples 27-31).

Example 35 provides a method of fabricating an microelectronic device that may include one or more of the transistor arrangements according to any one of the preceding examples, the method comprising processes for forming the one or more of the transistor arrangements according to any one of the preceding examples (e.g., each of the one or more of the transistor arrangements may be transistor arrangements according to any one of examples 1-18).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A transistor arrangement, comprising:
   a backside layer comprising a dielectric material;
   an electrically conductive line;
   a nanoribbon of a semiconductor material, wherein a longitudinal axis of the nanoribbon is substantially parallel to the backside layer, and wherein the backside layer is between the nanoribbon and the electrically conductive line;
   a transistor that includes:
   a channel portion that includes a portion of the semiconductor material of the nanoribbon, a gate stack, at least partially wrapping around the channel portion, and a first region and a second region in the nanoribbon, on either side of the channel portion, wherein one of the first region and the second region is a source region of the transistor and another one of the first region and the second region is a drain region of the transistor; and
   a backside contact that includes a via that extends through the backside layer, the via having a first portion that has a first end directly electrically connected with the electrically conductive line, and further having a second portion that has a second end directly electrically connected with the first region, wherein a dimension of the first region in a direction of the longitudinal axis of the nanoribbon and in a middle of the nanoribbon is smaller than a dimension of the first portion of the via in the direction of the longitudinal axis of the nanoribbon, and wherein a distance between the first region and the electrically conductive line is smaller than a distance between the second region and the electrically conductive line.

2. The transistor arrangement according to claim 1, wherein:
   the dielectric material is a first dielectric material one or more sidewalls of the via are lined with a second dielectric material, and a dielectric constant of the second dielectric material is higher than a dielectric constant of the first dielectric material and is lower than 6.

3. The transistor arrangement according to claim 2, wherein the dielectric constant of the first dielectric material is lower than 3.5.

4. The transistor arrangement according to claim 2, wherein the dielectric constant of the second dielectric material is between about 3.5 and about 5.5.

5. The transistor arrangement according to claim 2, wherein a density of the second dielectric material is higher than a density of the first dielectric material.

6. The transistor arrangement according to claim 5, wherein the density of the first dielectric material is lower than 1.8 gram per cubic centimeter.

7. The transistor arrangement according to claim 5, wherein the density of the second dielectric material is above 1.8 gram per cubic centimeter.

8. The transistor arrangement according to claim 5, wherein the density of the second dielectric material is between about 1.9 and about 2.5 gram per cubic centimeter.

9. The transistor arrangement according to claim 2, wherein the one or more sidewalls of the via have:
   a horizontal sidewall portion between the first portion and the second portion of the via, the horizontal sidewall portion being substantially parallel to a plane of the longitudinal axis of the nanoribbon, and a vertical sidewall portion between the horizontal sidewall portion and a surface of the backside layer, wherein a thickness of the second dielectric material over the horizontal sidewall portion is smaller than a thickness of the second dielectric material over the vertical sidewall portion.

10. The transistor arrangement according to claim 2, further including the second dielectric material between the second region and the first dielectric material.

11. The transistor arrangement according to claim 1, wherein:
    the first region of the transistor includes a material, the second portion of the via has a first sub-portion and a second sub-portion, the first sub-portion being between the first region and the second sub-portion, the first sub-portion of the second portion of the via includes the material; and
    an individual one of the first portion of the via and the second sub-portion of the second portion of the via includes one or more electrically conductive materials of the backside contact.

12. The transistor arrangement according to claim 1, wherein the electrically conductive line is a power rail.

13. The transistor arrangement according to claim 1, further comprising a first-level interconnect layer over the nanoribbon, wherein a layer with the transistor is between the backside layer and the first-level interconnect layer.

14. The transistor arrangement according to claim 1, wherein the dimension of the first region in the direction of the longitudinal axis of the nanoribbon is smaller than the dimension of the first portion of the via in the direction of the longitudinal axis of the nanoribbon for all portions of the first region in the direction of the longitudinal axis of the nanoribbon.

15. The transistor arrangement according to claim 1, wherein no portion of the first region has a dimension in the direction of the longitudinal axis of the nanoribbon that is larger than the dimension of the first portion of the via in the direction of the longitudinal axis of the nanoribbon.

16. A transistor arrangement, comprising:
    a backside layer comprising a dielectric material;
    an electrically conductive line;
    a nanoribbon of a semiconductor material, wherein a longitudinal axis of the nanoribbon is substantially parallel to the backside layer, and wherein the backside layer is between the nanoribbon and the electrically conductive line;
    a transistor that includes: a channel portion that includes a portion of the semiconductor material of the nanoribbon, a gate stack, at least partially wrapping around the channel portion, and a first region and a second region in the nanoribbon, on either side of the channel portion, wherein one of the first region and the second region is a source region of the transistor and another one of the first region and the second region is a drain region of the transistor; and
    a via extending through the backside layer, the via having a first portion that has a first end directly electrically connected with the electrically conductive line, and further having a second portion that has a second end directly electrically connected with the first region,
wherein a dimension of the first region in a direction of the longitudinal axis of the nanoribbon and in a middle of the nanoribbon is smaller than a dimension of the first portion of the via in the direction of the longitudinal axis of the nanoribbon, a dimension of the second portion of the via in the direction of the longitudinal axis of the nanoribbon is smaller than the dimension of the first portion of the via in the direction of the longitudinal axis of the nanoribbon, a portion of the second portion of the via has a subportion, the subportion is closer to the first region than a remainder of the second portion of the via, and the first region extends into the subportion.

17. The transistor arrangement according to claim 16, wherein:
the dielectric material is a first dielectric material, a sidewall of the first portion of the via is lined with a second dielectric material, a sidewall of the second portion of the via is lined with the second dielectric material, and the second dielectric material at the sidewall of the first portion of the via is materially continuous with the second dielectric material at the sidewall of the second portion of the via.

18. A transistor arrangement, comprising:
a backside layer comprising a first dielectric material; an electrically conductive line;
a nanoribbon of a semiconductor material, wherein a longitudinal axis of the nanoribbon is substantially parallel to the backside layer, and wherein the backside layer is between the nanoribbon and the electrically conductive line;
a transistor that includes:
a channel portion that includes a portion of the semiconductor material of the nanoribbon, a gate stack, at least partially wrapping around the channel portion, and a first region and a second region in the nanoribbon, on either side of the channel portion, wherein one of the first region and the second region is a source region of the transistor and another one of the first region and the second region is a drain region of the transistor;
a via extending through the backside layer, the via comprising:
a first portion that has a first end directly electrically connected with the electrically conductive line, a second portion that has a second end directly electrically connected with the first region, and a subportion within the second portion, wherein the subportion is closer to the first region than a remainder of the second portion of the via, and wherein the first region extends into the subportion; and
a second dielectric material, wherein a first portion of the second dielectric material is on a sidewall of the via, and a second portion of the second dielectric material is between the second region and the first dielectric material, wherein a distance between the electrically conductive line and first region extending into the subportion is smaller than a distance between the electrically conductive line and the second portion of the second dielectric material.

19. The transistor arrangement according to claim 18, wherein the second portion of the second dielectric material is materially discontinuous with the first portion of the second dielectric material.

20. The transistor arrangement according to claim 1, wherein a portion of a material of the first region extends from the nanoribbon towards the electrically conductive line, a portion of a material of the second region extends from the nanoribbon towards the electrically conductive line, and a distance between the electrically conductive line and the portion of the material of the first region extending from the nanoribbon towards the electrically conductive line is smaller than a distance between the electrically conductive line and the portion of the material of the second region extending from the nanoribbon towards the electrically conductive line.

* * * * *

UNITED STATES PATENT AND TRADEMARK OFFICE
CERTIFICATE OF CORRECTION

| | | |
|---|---|---|
| PATENT NO. | : 12,148,751 B2 | Page 1 of 1 |
| APPLICATION NO. | : 17/084977 | |
| DATED | : November 19, 2024 | |
| INVENTOR(S) | : Andy Chih-Hung Wei et al. | |

It is certified that error appears in the above-identified patent and that said Letters Patent is hereby corrected as shown below:

In the Claims

In Column 37, Claim 2, Line 47, delete "material" and insert -- material, --, therefor.

In Column 38, Claim 9, Line 14, delete "overthe" and insert -- over the --, therefor.

In Column 38, Claim 13, Line 34, delete "first-levelinterconnect" and insert -- first-level interconnect --, therefor.

In Column 38, Claim 16, Line 61, delete "eitherside" and insert -- either side --, therefor.

Signed and Sealed this
Thirty-first Day of December, 2024

Derrick Brent
*Acting Director of the United States Patent and Trademark Office*